(12) United States Patent
Kozawa et al.

(10) Patent No.: US 8,198,014 B2
(45) Date of Patent: Jun. 12, 2012

(54) RESIST COVER FILM FORMING MATERIAL, RESIST PATTERN FORMING METHOD, AND ELECTRONIC DEVICE AND METHOD FOR MANUFACTURING THE SAME

(75) Inventors: Miwa Kozawa, Kawasaki (JP); Koji Nozaki, Kawasaki (JP); Takahisa Namiki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 916 days.

(21) Appl. No.: 11/831,524

(22) Filed: Jul. 31, 2007

(65) Prior Publication Data
US 2008/0220223 A1    Sep. 11, 2008

(30) Foreign Application Priority Data

Aug. 30, 2006 (JP) .................................. 2006-234182

(51) Int. Cl.
 G03F 7/11 (2006.01)
 G03F 7/20 (2006.01)
 G03F 7/30 (2006.01)
 G03F 7/36 (2006.01)
(52) U.S. Cl. ........ 430/311; 430/313; 430/317; 430/323; 430/325; 430/326; 430/272.1; 430/273.1
(58) Field of Classification Search .................... None
See application file for complete search history.

(56) References Cited

U.S. PATENT DOCUMENTS

| 6,342,562 B1 | 1/2002 | Kozawa et al. |
| 6,541,077 B1 | 4/2003 | Kozawa et al. |
| 6,555,607 B1 | 4/2003 | Kanda et al. |
| 6,566,040 B1 | 5/2003 | Sugino et al. |
| 6,579,657 B1 | 6/2003 | Ishibashi et al. |
| 2002/0120058 A1* | 8/2002 | Kozawa et al. ............... 524/588 |
| 2003/0211407 A1 | 11/2003 | Watanabe et al. |
| 2004/0029047 A1 | 2/2004 | Ishibashi et al. |
| 2004/0072098 A1 | 4/2004 | Kozawa et al. |
| 2005/0038216 A1 | 2/2005 | Kozawa et al. |
| 2005/0147920 A1* | 7/2005 | Lin et al. ...................... 430/311 |

(Continued)

FOREIGN PATENT DOCUMENTS

DE  10018852 A1  3/2001

(Continued)

OTHER PUBLICATIONS

Derwent English abstract for JP2006-243395 (Sep. 2006).*

(Continued)

*Primary Examiner* — Sin J. Lee
(74) *Attorney, Agent, or Firm* — Westerman, Hattori, Daniels & Adrian, LLP

(57) ABSTRACT

To provide a material including: a silicon-containing polymer having at least an alkali-soluble group and is represented by the following general formula (1); and an organic solvent capable of dissolving the silicon-containing polymer.

$$(SiO_{4/2})_a(R^1_t SiO_{(4-t)/2})_b(O_{1/2}R^2)_c \quad \text{general formula (1)}$$

where $R^1$ represents at least one of a monovalent organic group, hydrogen atom and hydroxyl group, $R^2$ represents at least one of a monovalent organic group and hydrogen atom (where $R^1$ and $R^2$ each may appear twice or more, and at least one of $R^1$ and $R^2$ contains an alkali-soluble group), "t" represents an integer of 1 to 3, "a," "b," and "c" represent the relative proportions of their units (where $a \geq 0$, $b \geq 0$ and $c \geq 0$, and "a," "b," and "c" are not 0 at the same time), and $(R^1_t SiO_{(4-t)/2})_b$ may appear twice or more.

13 Claims, 24 Drawing Sheets

U.S. PATENT DOCUMENTS

| | | | |
|---|---|---|---|
| 2005/0242440 A1* | 11/2005 | Owada et al. | 257/758 |
| 2006/0029884 A1 | 2/2006 | Hatakeyama et al. | |
| 2006/0188807 A1 | 8/2006 | Nozaki et al. | |
| 2006/0189779 A1 | 8/2006 | Allen et al. | |
| 2008/0227028 A1 | 9/2008 | Allen et al. | |
| 2009/0011377 A1 | 1/2009 | Allen et al. | |

FOREIGN PATENT DOCUMENTS

| | | | |
|---|---|---|---|
| DE | 10123935 A1 | | 11/2001 |
| EP | 1083205 A1 | | 3/2001 |
| EP | 1429185 A1 | | 6/2004 |
| JP | 62-065326 A | | 3/1987 |
| JP | 5-197151 A | | 8/1993 |
| JP | 10-73927 A | | 3/1998 |
| JP | 11-176727 A | | 7/1999 |
| JP | 11-204399 A | | 7/1999 |
| JP | 2000-58506 A | | 2/2000 |
| JP | 2000-267268 A | | 9/2000 |
| JP | 2000-298356 A | | 10/2000 |
| JP | 2000-347414 A | | 12/2000 |
| JP | 2001-5185 A | | 1/2001 |
| JP | 2001-19860 A | | 1/2001 |
| JP | 2001-033984 A | | 2/2001 |
| JP | 2001-228616 A | | 8/2001 |
| JP | 2002-6491 A | | 1/2002 |
| JP | 2002-6512 A | | 1/2002 |
| JP | 2002-49161 A | | 2/2002 |
| JP | 2002-365801 A | | 12/2002 |
| JP | 2003-84457 A | | 3/2003 |
| JP | 2003-131400 A | | 5/2003 |
| JP | 2004-53723 A | | 2/2004 |
| JP | 2004-86203 A | | 3/2004 |
| JP | 2004-126080 A | | 4/2004 |
| JP | 2004-264373 A | | 9/2004 |
| JP | 2006-243395 | * | 9/2006 |
| JP | 2006-251794 A | | 9/2006 |
| JP | 2006-259692 A | | 9/2006 |
| KR | 2003-0057486 A | | 7/2003 |
| WO | 2004074941 A1 | | 9/2004 |
| WO | WO 2006/049792 A1 | | 5/2006 |
| WO | WO 2006/088571 A1 | | 8/2006 |

OTHER PUBLICATIONS

Machine-assisted English translation for JP2006-243395 (Sep. 2006).*
Chinese Office Action dated Feb. 5, 2010, issued in corresponding Chinese Patent Application No. 2007-10146875.2.
Takeo Ishibashi et al.; "Advanced Micro-Lithography Process with Chemical Shrink Technology", The Japan Society of Applied Physics, vol. 40, Part. 1, No. 1, Jan. 2001, pp. 419-425.
Mamoru Terai et al.; "Below 70-nm Contact Hole Pattern with RELACS Process for ArF Resist", Advances in Resist Technology and Processing XX, Proceedings of SPIE, vol. 5039, 2003, pp. 789-797.
German Office Action dated May 20, 2008, issued in corresponding German Patent Application No. DE102007035767.4.
Korean Office Action dated May 26, 2008, issued in corresponding Korean Patent Application No. 10-2007-0082298.
Japanese Office Action dated Mar. 8, 2011, issued in corresponding Japanese Patent Application No. 2006-234182.
German Office Action dated Aug. 10, 2011, issued in corresponding Germany Patent Application No. 102007035766.6.

* cited by examiner

Scanning Movement

RESIST COVER FILM FORMING MATERIAL, RESIST PATTERN FORMING METHOD, AND ELECTRONIC DEVICE AND METHOD FOR MANUFACTURING THE SAME

CROSS-REFERENCE TO RELATED APPLICATIONS

This application is based upon and claims the benefits of the priority from the prior Japanese Patent Application No. 2006-234182 filed on Aug. 30, 2006, the entire contents of which are incorporated herein by reference.

BACKGROUND OF THE INVENTION

1. Field of the Invention

The present invention relates to a resist cover film forming material that is suitably used for the manufacture of an immersion exposure resist cover film that serves to protect a resist film against a medium (liquid) in the immersion exposure technology and that has a high ArF excimer laser and/or $F_2$ excimer laser transmittance, the immersion exposure technology intending to achieve an improved resolution by filling the gap created between the projection lens of an exposure device and a wafer with a medium having a refraction index (n) of greater than 1 (the value for air); a resist pattern forming method using the resist cover film forming material; and an electronic device and a manufacturing method for the same.

2. Description of the Related Art

In recent years semiconductor integrated circuits have been highly integrated, with minimum linewidths being reduced to as small as 100 nm or less. Fine patterns have conventionally been obtained for instance by a method that comprises the steps of covering a thin film-deposited work surface with a resist film, selectively exposing the resist film, developing the resist film to form a resist pattern, performing dry etching using the resist pattern as a mask, and removing the resist pattern to form a desired pattern in the workpiece.

It is required for the achievement of finer patterns to shorten the wavelength of the exposure light and to develop a resist material that is suitable for the characteristics of the exposure light for a high-resolution pattern. Improvement on an exposure device for a shorter exposure light wavelength, however, has met with difficulty because of enormous development costs. In recent years an ArF (argon fluoride) excimer laser with a wavelength of 193 nm has been extensively put into practice use as a next generation exposure light source, replacing a conventional KrF (krypton fluoride) excimer laser having a wavelength of 248 nm. Accordingly, ArF excimer laser-equipped exposure devices are now on the market; however, they are still fairly expensive. Moreover, developments for resist materials to which exposure light of shorter wavelengths can be applied are not also easy, and as such these resist materials have not therefore been provided yet. For this reason, it has been difficult for the conventional resist pattern forming method to provide finer patterns.

The immersion exposure technology has become a focus of attention as an up-to-date exposure technology. With this technology an increased resolution can be obtained by filling the gap, created between the projection lens of a stepper and a wafer, with a medium (liquid) with a refraction index of greater than 1 (the value for air). The resolution of the stepper can be generally represented by the formula "resolution=k (process factor)×λ(wavelength)/NA (numerical aperture)"; the shorter the wavelength and the greater the NA of the projection lens, the greater the resolution. NA is obtained by "NA=n×sin α" where "n" is a refraction index of medium through which exposure light passes and "α" is the maximum incident angle of the exposure light. Since the exposure step in the conventional pattern forming method is conducted in the air, the refraction index of medium is 1. The immersion exposure technology, on the other hand, utilizes between the projection lens and a wafer a liquid with a refraction index of greater than 1. This increases "n" in the NA formula and thereby the minimum resolvable dimension can be reduced by a factor of "n" provided "α" is constant. In addition, there is an advantage that "α" can be reduced and depth of focus (DOF) can be increased by a factor of "n" provided NA is constant.

Such an immersion technology that involves the use of liquid with a refraction index that is greater than that of air has been a known technology in the field of microscopes, however its application to the fine processing technology has been made only by proposing an exposure device in which liquid is placed between a lens and a wafer, the liquid having a refraction index that is substantially equal to or slightly smaller than that of the lens (see Japanese Patent Application Laid-Open (JP-A) No. 62-065326). Because attempts to apply the immersion technology to the fine processing technology started just in the last few years, the current situation is that problems are gradually emerging with respect to the immersion exposure device and resist materials used in this device.

One of the foregoing problems is a situation where a resist film is exposed to liquid (e.g., water) filling up the gap between the projection lens and a wafer, releasing an acidic ingredient, generated in the resist film upon exposure, into the liquid to result in poor resist sensitivity. In addition, when the water-infiltrated resist film is exposed to an excimer laser, certain chemical reactions may occur that impair the resist's original performance and that soils the projection lens by degasification. The dirt on the lens is problematic because it results in exposure failure and poor resolving power.

Although a strategy that aims to form a resist cover film over the upper surface of the resist film has been considered in order to overcome these problems, this strategy has met with difficulty in forming such a resist cover film without dissolving therein the resist film and without causing the resist cover film to mix with the resist film. In addition, both the ArF excimer laser of 193 nm wavelength and the F2 excimer laser beam of 157 nm wavelength, the latter of which is much shorter than the ArF excimer laser in wavelength, do not pass through general organic materials. For this reason, the range of available materials for the resist cover film is extremely small. Even when it succeeded in obtaining such a material, this material does not dissolve in alkali general developers. Accordingly, the resist cover film needs to be removed prior to development by use of a remover specifically designed for the resist cover film. It is also required to ensure the primary purpose of preventing the elution of unwanted resist ingredients in the exposure medium Accordingly, any material that can be used for the manufacture of an immersion exposure resist cover film has not yet been provided, which the resist cover film is capable of being formed on a resist film without dissolving therein the resist film, of preventing elution of ingredients of the resist film in a liquid with a high refraction index that fills up the gap between the projection lens of an exposure device and a wafer and infiltration of the liquid into the resist film, and of being removed readily; which never impairs the original resist performance; and which has a high ArF and $F_2$ excimer lasers transmittance. Furthermore, no related technology has been provided that utilizes this material. Thus, developments of this technology have been demanded.

It is an object of the present invention to solve the foregoing problems and to achieve the objects described below.

That is, an object of the present invention is to provide a resist cover film forming material that is suitably used for the manufacture of an exposure immersion resist cover film used to protect a resist film against a medium in the immersion exposure technology and that has a high ArF excimer laser and/or $F_2$ excimer laser transmittance, the immersion exposure technology intending to achieve an improved resolution by filling the gap created between the projection lens of an exposure device and a wafer with a medium having a refraction index (n) of greater than 1 (the value for air).

Another object of the present invention is to provide a resist pattern forming method capable of high-resolution immersion exposure by protecting the resist film against the liquid and by preventing the generation of dirt on the lens without impairing the resist film performance, for achieving efficient and easy formation of a fine, high-resolution resist pattern.

Still another object of the present invention is to provide a method for manufacturing an electronic device, which the method is capable of formation of a fine, high-resolution resist pattern by means of immersion exposure without impairing the resist pattern performance and of efficient mass production of a high-performance electronic device having a fine interconnection pattern formed using the resist pattern, and a high performance electronic device such as a semiconductor device, which has a fine interconnection pattern and manufactured using this manufacturing method.

BRIEF SUMMARY OF THE INVENTION

The present inventors have conducted extensive studies to solve the foregoing problems and have obtained the following finding: In the immersion exposure technology, the use of a material that includes at least a silicon-containing polymer having an alkali-soluble group and an organic solvent capable of dissolving the silicon-containing polymer can provide a resist cover film which is: capable of being formed on a resist film without dissolving therein the resist film, of preventing elution of resist film ingredients in a liquid with a high refraction index that fills up the gap between the projection lens of an exposure device and a wafer and infiltration of the liquid into the resist film, and of being removed readily; which never impairs the original resist performance; and which has a high ArF and $F_2$ excimer lasers transmittance.

The present invention is based on the foregoing finding, and the means to solve the foregoing problems are described in appended claims.

That is, the material of the present invention includes: a silicon-containing polymer which has at least an alkali-soluble group and which is represented by the following general formula (1); and an organic solvent capable of dissolving the silicon-containing polymer, wherein the resist cover film forming material is used for the formation of a resist cover film for covering a resist film upon immersion exposure to the resist film. Thus the resist cover film formed using this resist cover film forming material efficiently protects a resist film against a liquid with a high refractive index that fills up the gap between a projection lens of and a wafer, prevents elution of resist film ingredients in the liquid and infiltration of the liquid into the resist film, never impairs the original resist performance, has a high ArF excimer laser and/or $F_2$ excimer laser transmittance, and can be readily removed.

$$(SiO_{4/2})_a(R^1_tSiO_{(4-t)/2})_b(O_{1/2}R^2)_c \quad \text{general formula (1)}$$

where $R^1$ represents at least one of a monovalent organic group, hydrogen atom and hydroxyl group, $R^2$ represents at least one of a monovalent organic group and hydrogen atom (where $R^1$ and $R^2$ each may appear twice or more, and at least one of $R^1$ and $R^2$ contains an alkali-soluble group), "t" represents an integer of 1 to 3, "a," "b," and "c" represent the relative proportions of their units (where $a \geqq 0$, $b \geqq 0$ and $c \geqq 0$, and "a," "b," and "c" are not 0 at the same time), and $(R^1_tSiO_{(4-t)/2})_b$ may appear twice or more The resist pattern forming method of the present invention includes: forming a resist film over a work surface; forming a resist cover film over the resist film by use of the material of the present invention, irradiating the resist film with exposure light through the resist cover film by means of immersion exposure; and developing the resist film.

In this resist pattern forming method, a resist film is formed on a work surface, and thereafter, a resist cover film is formed on the resist film by use of the material of the present invention. Since the resist cover is formed of the material of the present invention, it is formed on the resist film without dissolving therein the resist film. Exposure is then conducted on the resist film through the resist cover film by irradiation with exposure light by means of immersion exposure. Since the resist cover film is formed of the material of the present invention, elution of resist film ingredients in a liquid having a high refraction index that fills up the gap between a projection lens and a wafer, and infiltration of the liquid into the resist film can be prevented, thereby making patterning possible without impairing the original resist performance. In addition, the resist cover film thus prepared has a high ArF excimer laser and/or $F_2$ excimer laser transmittance, whereby high-resolution exposure is made possible. In the subsequent development, the resist cover film can be readily removed using a general developer and thus can be removed together with the resist film. In this way a resist pattern is formed efficiently and readily. The resist pattern thus prepared has a fine, high-resolution pattern because high-resolution exposure has been conducted without impairing its performance.

The method of the present invention for manufacturing an electronic device includes: forming a resist pattern over a work surface; forming a resist cover film over the resist film by use of the material of the present invention; irradiating the resist film with exposure light through the resist cover film by means of immersion exposure; developing the resist film to form a resist pattern; and patterning the work surface by etching using the resist pattern as a mask.

In this method, a resist film is first formed on a work surface to be provided with a pattern (e.g., interconnection pattern), and thereafter, a resist cover film is formed on the resist film by use of the material of the present invention. Since the resist cover is formed of the material of the present invention, it is formed on the resist film without dissolving therein the resist film. Exposure is then conducted on the resist film through the resist cover film by irradiation with exposure light by means of immersion exposure. Since the resist cover film is formed of the material of the present invention, elution of resist film ingredients in a liquid having a high refraction index that fills up the gap between a projection lens and a wafer, and infiltration of the liquid into the resist film can be prevented, thereby making patterning possible without impairing the original resist performance. In addition, the resist cover film thus prepared has a high ArF excimer laser and/or $F_2$ excimer laser transmittance, whereby high-resolution exposure is made possible. In the subsequent development, the resist cover film can be readily removed using a general developer and thus can be removed together with the resist film. In this way a resist pattern is formed efficiently and readily. The resist pattern thus prepared has a fine, high-resolution pattern because high-resolution exposure has been conducted without impairing its performance.

Subsequently, the work surface is patterned with high precision to form a fine, high-resolution pattern therein by etching it using the resist pattern prepared in the above resist pattern forming step. In this way, it is possible to manufacture a high-quality, high-performance electronic device such as a semiconductor device provided with highly fine, high-resolution patterns (e.g., interconnection patterns) prepared with high precision.

The electronic device of the present invention is manufactured with the method of the present invention for manufacturing an electronic device. The electronic device of the present invention is provided with highly fine, high-resolution patterns (e.g., interconnection patterns) prepared with high precision, and is of high-quality and high-performance.

Figure 1:
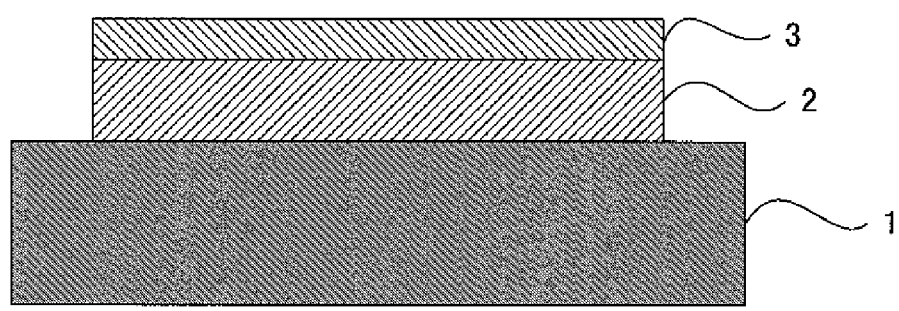
FIG. 1 is a schematic view for explaining an example of the resist pattern forming method of the present invention, showing a state where a resist cover film has been formed.

DETAILED DESCRIPTION OF THE INVENTION (Resist Cover Film Forming Material)

The resist cover film forming material of the present invention comprises at least a silicon-containing polymer having at least an alkali-soluble group, and an organic solvent, and further comprises additional ingredient(s) appropriately selected, where necessary.

A resist cover film formed by using the resist cover film forming material is not particularly limited as long as it is alkali-soluble and has a high solubility in alkali developers; for example, its dissolution rate in 2.38% (by mass) aqueous tetramethylammonium hydroxide (TMAH) of 25° C. is preferably 30 nm/sec or more, more preferably 100 nm/sec or more and, most preferably, 200 nm/sec or more. In addition, the upper limit of the dissolution rate is preferably 10,000 nm/sec, more preferably 2,000 nm/sec.

If the resist cover film is alkali-soluble, it can be readily removed upon development by dissolving it in an alkali developer together with the resist film.

The measurement method for the dissolution rate is not particularly limited and can be appropriately selected from those known in the art. For example, the Dissolution Rate Monitor (DRM) utilizing the interference of laser beams, or the Quarts Crystal Microbalance (QCM) that utilizes a crystal microbalance to measure mass change based on its frequency change can be used. Since the resist cover film has a very high solubility in alkali medium, the QCM is more preferable because it is capable of high precision measurement.

Moreover, it is preferable to conduct immersion exposure while using an immersion medium (liquid) with a refraction index of greater than 1, as will be described later. Thus the resist cover film formed by using the resist cover film forming material preferably has a refraction index of greater than 1, more preferably 1.4 or more for exposure light. This is because a refraction index of less than that of the immersion medium (liquid) results in imaging failure.

-Silicon-Containing Polymer-

It is required for the silicon-containing polymer to have at least an alkali-soluble group and a silicon atom, and to be a polymer represented by the following general formula (1). By allowing silicon atoms to be contained in its skeletal structure its capability of absorbing an ArF excimer laser light (wavelength=193 nm) or an $F_2$ excimer laser light (wavelength=157 nm) becomes lower than that of general organic materials. For this reason, when a resist cover film containing this silicon-containing polymer is formed on a resist film and exposed to any of these lasers, the laser passes through the resist cover film and creates a resist pattern. Meanwhile, silicon-containing polymers are inherently highly hydrophobic polymers and thus have much lower water permeability than general organic materials. The silicon-containing polymer used in the resist cover film forming material of the present invention, obtained by imparting hydrophilic property to such a silicon-containing polymer, dissolves in a resist developer, a strong alkali medium, but offers low water solubility and low water permeability. Accordingly, the silicon-containing polymer is suitable for the manufacture of a resist cover film that prevents elution of acids or the like from a resist film and that prevents the occurrence of side reactions due to the infiltration of liquid into the resist film

general formula (1)

where $R^1$ represents at least one of a monovalent organic group, hydrogen atom and hydroxyl group, $R^2$ represents at least one of a monovalent organic group and hydrogen atom (where $R^1$ and $R^2$ each may appear twice or more, and at least one of $R^1$ and $R^2$ contains an alkali-soluble group), "t" represents an integer of 1 to 3, "a," "b," and "c" represent the relative proportions of their units (where a≧0, b≧0 and c≧0, and "a," "b," and "c" are not 0 at the same time), and $(R^1_tSiO_{(4-t)/2})_b$ may appear twice or more.

That is, the general formula (1) also encompass compounds as represented by the following general formula (2), where the unit $(R^1_tSiO_{(4-t)/2})_b$ appear twice or more.

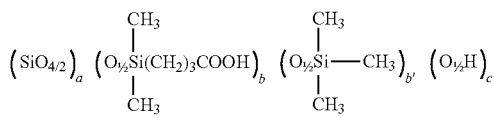
general formula (2)

The alkali-soluble group is not particularly limited and can be appropriately selected depending on the intended purpose; examples include carboxylic acid-containing groups, phenol-containing groups and hexafluorocarbinol-containing groups. Among these, carboxylic acid-containing groups are preferable because they are identical to alkali-soluble groups present in acrylic polymers used in resist materials to which an ArF excimer laser can be applied, and because a resist cover film containing a carboxylic acid-containing group as an alkali-soluble group is completely dissolved in an alkali developer and removed together with a resist film upon development, without causing any film separation and generating undeveloped portions.

The carboxylic acid-containing group is not particularly limited as long as it has, as its part, a carboxylic group, and can be appropriately selected depending on the intended purpose. In view of easy preparation of the silicon-containing polymer and of excellent alkali-solubility, the carboxylic acid-containing group is preferably a moiety represented by the following general formula (3).

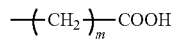
general formula (3)

where "m" satisfies the condition 0≦m≦5, preferably the condition 1<m≦3.

The monovalent organic group represented by $R^1$ and $R^2$, other than the alkali-soluble group, in the general formula (1) is not particularly limited and can be appropriately selected depending on the intended purpose; examples of such a monovalent organic group include alkyl groups, alkoxy groups, formyl groups, carbonyl groups, alkoxycarbonyl groups, and alkyl groups substituted with an alkokyl group, formyl group, carbonyl group and/or alkoxylcarbonyl group. These monovalent organic groups are preferably formed of 1-10 carbon atoms. This is due to the fact that the glass transition temperature (Tg) of the silicon-containing polymer decreases with increasing length of the carbon chain, i.e., increasing number of carbon atoms. In this case, it may result in failure to obtain a resist cover film. Note also that two or more of the monovalent organic group may appear, as mentioned above.

A suitable example of the silicon-containing polymer is a silicon-containing polymer having a carboxylic acid, which is represented by the following general formula (2).

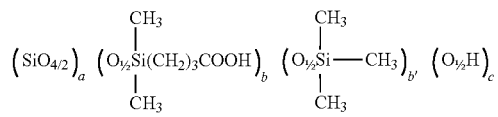
general formula (2)

where "a," "b," "b'," and "c" represent relative proportions of their units, and a>0, b>0, b'>0 and c≧0.

The weight-average molecular weight of the silicon-containing polymer having at least the foregoing alkali-soluble group is not particularly limited and can be appropriately set depending on the intended purpose; for example, the weight-average molecular weight is preferably 1,000 to 1,000,000, more preferably 2,000 to 100,000 in terms of the equivalent polystyrene molecular weight.

A weight-average molecular weight of less than 1,000 may result in poor heat resistance, whereas a weight-average molecular weight of greater than 1,000,000 may result in poor coating property.

The weight-average molecular weight can be measured for instance by Gel Permeation Chromatography (GPC), a liquid chromatography that separates molecules according to the difference in their size.

The content of the silicon-containing polymer having at least the alkali-soluble group in the resist cover film forming material is not particularly limited and can be appropriately set depending on the intended purpose; for example, the content is preferably 0.1% by mass to 20% by mass, more preferably 1% by mass to 5% by mass. A content of less than 0.1% by mass may result in poor film formation property (e.g., generation of pinholes), whereas a content of greater than 20% by mass may result in low transmission of exposure light, resulting in low resolving power upon resist film exposure -Organic Solvent- The organic solvent is not particularly limited as long as it is capable of dissolving the silicon-containing polymer, and can be appropriately selected depending on the intended purpose; organic solvents that are incapable of dissolving the resist film are preferable. For example, aliphatic alkanols having 3 or more carbon atoms are preferable, and aliphatic alkanols having 4 or more carbon atoms are more preferable. If the number of carbon atoms is 2 or less, the solubility of the silicon-containing polymer may be reduced.

The aliphatic alkanols having 3 or more carbon atoms are not particularly limited and a suitable one can be appropriately selected depending on the intended purpose; suitable examples include n-butyl alcohol and isobutyl alcohol. These aliphatic alkanols may be used singly or in combination.

The content of the organic solvent in the resist cover film forming material is not particularly limited and can be appropriately set depending on the intended purpose.

-Additional Ingredient-

The additional ingredient is not particularly limited as long as the effect of the present invention is not adversely affected, and can be appropriately selected depending on the intended purpose; examples include various known additives. For example, a surfactant may be added when intending to increase the coating property.

The surfactant is not particularly limited and can be appropriately selected from nonionic surfactants, cationic surfactants, anionic surfactants and amphoteric surfactants depending on the intended purpose. Among them, nonionic surfactants are preferable in view of the absence of metallic ions.

Suitable examples of the nonionic surfactants include alkoxylate surfactants, fatty acid ester surfactants, amide surfactants, alcohol surfactants and ethylenediamine surfactants; specific examples thereof include polyoxyethylene-polyoxypropylene condensation products, polyoxyalkylene alkyl ethers, polyoxyethylene alkyl ethers, polyoxyethylene derivatives, sorbitan fatty acid esters, glycerine fatty acid esters, primary alcohol ethoxylates, phenol ethoxylates, nonylphenol ethoxylates, octylphenol ethoxylates, lauryl alcohol ethoxylates, oleyl alcohol ethoxylates, fatty acid esters, amides, natural alcohols, ethylenediamines and secondary alcohol ethoxylates.

The cationic surfactants are not particularly limited and can be selected depending on the intended use; examples thereof include alkyl cationic surfactants, amide quaternary cationic surfactants and ester quaternary cationic surfactants.

The amphoteric surfactants are not particularly limited and can be appropriately selected depending on the intended use; examples thereof include amine oxide surfactants and betaine surfactants.

The content of the surfactant in the resist cover film forming material can be appropriately set depending on the type, content, etc., of the silicon-containing polymer having the alkali-soluble group, the organic solvent, etc.

-Usage and the Like-

The resist cover film forming material of the present invention is preferably applied over a resist film for use, and the coating method for this is not particularly limited and can be appropriately selected depending on the intended purpose; for example, spin coating is used.

Once the resist cover film forming material is applied over a resist film, a cover film is formed over the resist film.

Since the resist cover film forming material comprises the silicon-containing polymer and an organic solvent capable of dissolving the silicon-containing polymer, the cover film is formed without causing dissolution of the resist film. In addition, since the silicon-containing polymer is a polymer containing silicon atoms in its skeletal structure, its capability of absorbing an ArF excimer laser (wavelength=193 nm) or an F2 excimer laser (wavelength=157 nm) is lower than that of general organic materials. For this reason, when the resist cover film is applied over the resist film and then exposed to such exposure light it succeeds in forming a resist pattern. Furthermore, since the silicon-containing polymer has the alkali-soluble group, it can be dissolved in an alkali developer and thereby the resist cover film can be readily removed together with the resist film by dissolving them into an alkali developer.

The resist cover film preferably has an exposure light transmittance of 30% or more, more preferably 50% or more and, most preferably, 80% or more when the thickness is 100 nm. An exposure light transmittance of less than 30% may result in failure to obtain a fine, high-resolution resist pattern because high-resolution exposure of the resist film cannot be enabled due to poor light transmittance.

The exposure light is not particularly limited and can be appropriately selected depending on the intended purpose; examples include a KrF excimer laser, an ArF excimer laser and an $F_2$ excimer laser. Among them, the ArF excimer laser (wavelength=193 nm) and $F_2$ excimer laser (wavelength=157 nm) are preferable in view of their short wavelength and capability of forming a high-resolution resist pattern.

-Resist Film Forming Material

The material of the foregoing resist film, a resist film over which the resist cover film forming material of the present invention is to be applied, is not particularly limited and can be appropriately selected from known resist materials according to the intended purpose; it may be either of negative or positive type. For example, suitable examples are KrF resists, ArF resists and $F_2$ resists, which can be respectively patterned using the KrF excimer laser, ArF excimer laser and $F_2$ excimer laser. These resists may be of either chemically amplified or non-chemically amplified type. Among them, KrF resists, ArF resists, and resists containing acrylic resins are preferable; furthermore, ArF resists and resists containing acrylic resins, where the need to improve their resolution limits is imperative, are more preferable in order to provide finer patterning and to improve throughput.

Specific examples of the resist film materials include novolac resists, PHS resists, acrylic resists, cycloolefin-maleic acid anhydrate (COMA) resists, cycloolefin resists, hybrid resists such as alicyclic acrylic-COMA copolymers. These resists may be modified by fluorine.

The forming process, size, thickness, etc., of the resist film are not particularly limited and can be appropriately set depending on the intended use. In particular, the thickness generally ranges from about 0.2 μm to 200 μm, though it can be appropriately determined depending on the type the work surface, etching conditions, etc.

The resist cover film forming material of the present invention can be suitably used for the formation of a resist cover film that serves, in the immersion exposure technology, to protect a resist film against a liquid with a low refraction index that fills up the gap between the projection lens of an exposure device and a wafer. The resist cover film forming material of the present invention can be suitably used in the resist pattern forming method of the present invention and in the method of the present invention for manufacturing an electronic device.

The resist cover film forming material of the present invention for immersion exposure is used in the following manner: A resist layer is formed on a work surface by applying thereon a first resist composition (e.g., an ArF resist composition formed of acrylic polymer), the resist cover film forming material of the present invention is applied on the resist layer to form a resist cover layer, the resist layer is patterned by exposure to, for example, an ArF excimer laser, and the both layers are developed using a 2.38% aqueous TMAH to form a resist pattern.

(Resist Pattern Forming Method)

The resist pattern forming method of the present invention includes the steps of forming a resist film over a work surface, forming a resist cover film over the resist film by using the resist cover film forming material of the present invention, irradiating the resist film with exposure light via the resist cover film by means of immersion exposure, and developing the resist film, and further includes additional step(s) appropriately selected, where necessary.

<Resist Film Forming Step>

The resist film forming step is a step of forming a resist film on a work surface.

Suitable examples of materials of the resist film are those given in the above description for the resist cover film forming material of the present invention.

The resist film can be formed using a known method, such as coating method.

The work surface is not particularly limited and can be appropriately selected depending on the intended purpose. In a case where the resist film is to be used for the manufacture of an electronic device such as a semiconductor device, a surface of a semiconductor substrate can be exemplified as the work surface. Suitable examples include surfaces of substrates such as silicon wafers and surfaces of various oxide films.

<Resist Cover Film Forming Step>

The resist cover film forming step is a step of forming a resist cover film on the resist film by using the resist cover film forming material of the present invention.

The formation of the resist cover film is preferably performed by means of coating, and the coating method is not particularly limited and can be appropriately selected from known coating methods. For example, spin coating or the like is preferably used. In the case of spin coating, preferable spin coating conditions are as follows: rotational speed is, for example, about 100 rpm to 10,000 rpm, more preferably 800 rpm to 5,000 rpm; and spin time is, for example, about 1 second to 10 minutes, more preferably about 1 second to 90 seconds.

The thickness of the resist cover film formed by means of the coating method is not particularly limited and can be appropriately set depending on the intended purpose; for example, the thickness is preferably 10 nm to 300 nm, more preferably 50 nm to 150 nm. If the thickness is less than 10 nm, it may result in defects such as generation of pinholes, whereas if the thickness exceeds 300 nm, the transmittance of ArF and $F_2$ excimer lasers may decrease and thereby the resolving power and/or exposure sensitivity may decrease.

It is preferable to bake (i.e., heat and dry) the resist cover film forming material upon or after the coating step, and the baking condition, baking method, etc., are not particularly limited as long as the resist film is not softened; the baking temperature is preferably about 40° C. to 150° C., more preferably 80° C. to 120° C., and the baking time is preferably about 10 seconds to 5 minutes, more preferably 30 seconds to 120 seconds.

<Immersion Exposure Step>

The immersion exposure step is a step of irradiating the resist film with exposure light through the resist cover film by means of immersion exposure.

The immersion exposure step can be suitably performed using a known immersion exposure device, whereby the resist film is irradiated with the exposure light via the resist cover film. In this step some portions of the resist film are selectively exposed to the exposure light and cured, and uncured portions in the resist film are removed in the subsequent development step to be described later. In this way a resist pattern is formed.

The liquid that is used in the immersion exposure step and fills up the gap between the projection lens of a stepper and a wafer is not particularly limited and can be appropriately selected depending on the intended purpose; however, for a high resolution, it is preferable to adopt a liquid with a refraction index of greater than that of air, i.e., 1.

The liquid with a refraction index of greater than 1 is not particularly limited and can be appropriately selected depending on the intended purpose; higher refraction indices are more preferable. Suitable examples of such a liquid are oils, glycerin, and alcohols. However, purified water (refraction index=1.44) is most preferable.

The exposure light is not particularly limited and can be appropriately selected depending on the intended purpose. Those with a shorter wavelength are preferable. For example, a KrF excimer laser (wavelength=248 mm), an ArF excimer laser (wavelength=193 nm), an $F_2$ excimer laser (wavelength=157 nm) and the like are exemplified. Among them, the ArF and $F_2$ excimer lasers are preferable in view of their capability of obtaining a high-resolution resist pattern.

In addition, for a substrate to be processed, any substrate can be used in which a finer pattern is to be formed by photolithography as in the manufacture of an electronic device such as a semiconductor device.

<Development Step>

The development step is a step of removing uncured portions of the resist film which had been subjected to the foregoing exposure step, to form a resist pattern.

The method of removing the uncured portions is not particularly limited and can be appropriately selected depending on the intended purpose; for example, a development method that uses a developer can be exemplified.

The developer is not particularly limited and can be appropriately selected depending on the intended purpose; however, an alkali developer is preferable because a resist cover film formed of the resist cover film forming material of the present invention can be removed together with the uncured portions of the resist film. The development step that entails the use of such an alkali developer allows the resist cover film to be removed together with unexposed portions of the resist film. In this way a resist pattern is formed (revealed).

Hereinafter, an example of the resist pattern forming method of the present invention will be described with reference to the drawings.

As shown in FIG. 1, after applying a resist forming material over a surface of workpiece substrate 1 to form a resist film 2, a resist cover film forming material is applied over the surface of the resist film 2, followed by baking (i.e., heating and drying) to form a resist cover film 3. The resist film 2 and the resist cover film 3 provided over the workpiece substrate 1 are then exposed to exposure light using an immersion exposure device 5 shown in FIG. 2.

Figure 2:
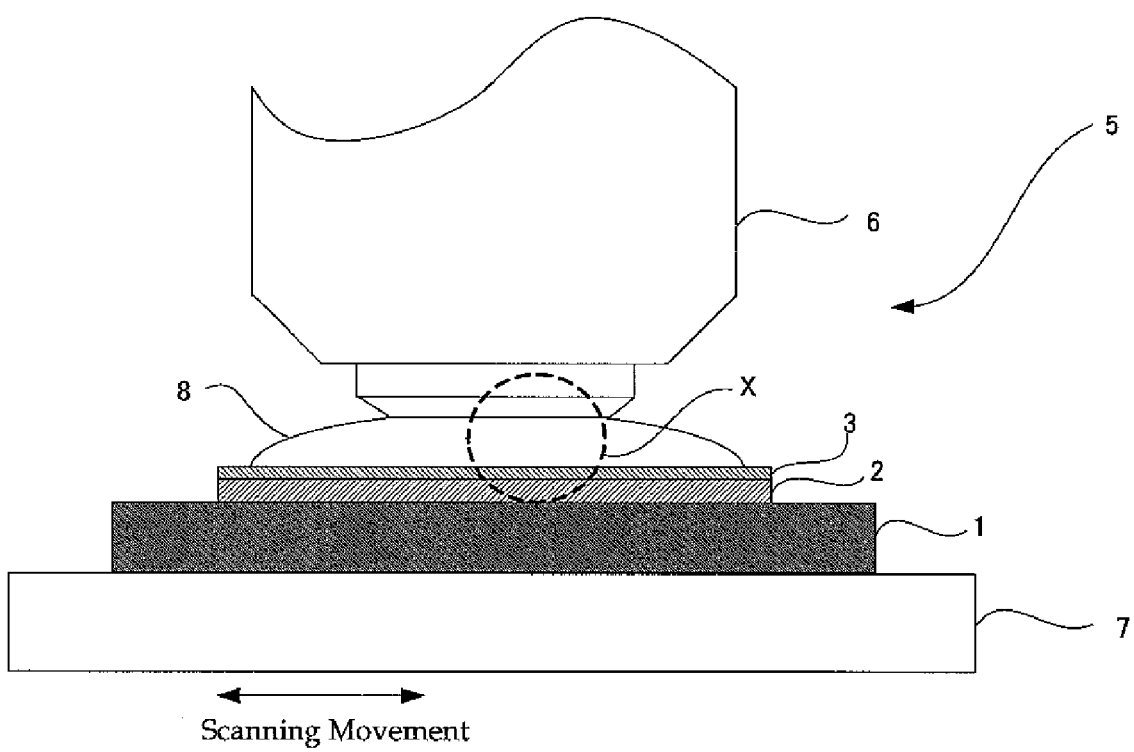
FIG. 2 is a schematic view for explaining an example of the resist pattern forming method of the present invention, showing an example of an immersion exposure device.

FIG. 2 is a schematic view of an example of an immersion exposure device. The immersion exposure device 5 includes a stepper (a step-and-repeat exposure device having a projection lens 6) and a wafer stage 7. The wafer stage 7 is provided so that the workpiece substrate 1 can be mounted thereon, and the projection lens 6 is so arranged that a medium (liquid) 8 fills up the gap formed between the projection lens 6 and the workpiece substrate 1 on the wafer stage 7. The resolution of the stepper is governed by the Rayleigh criterion represented by the following Equation (1); the shorter the wavelength of the exposure light and the greater the numerical aperture (NA) of the projection lens 6, the higher the resolution of the stepper.

$$\text{Resolution} = k \text{ (constant of proportion)} \times \lambda \text{(wavelength of light)} / NA \text{ (numerical aperture)}. \quad \text{Equation (1)}$$

Figure 3:
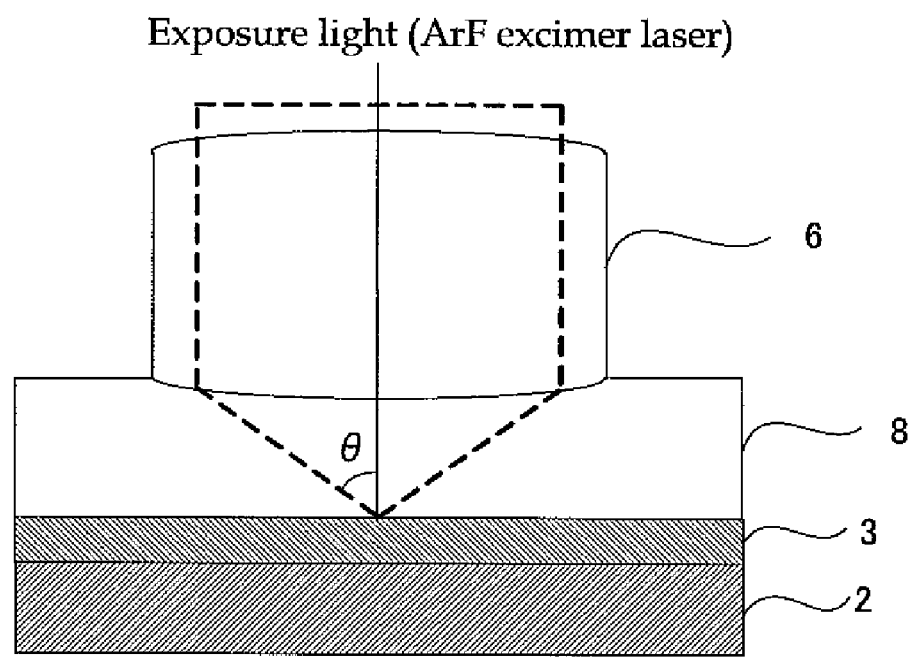
FIG. 3 is a partially enlarged view of the immersion exposure device shown in FIG. 2.

An enlarged view of the X portion of FIG. 2 is shown in FIG. 3. In FIG. 3 "n" denotes a refraction index of the medium (liquid) 8 through which the exposure light passes, and "θ" denotes an incident angle of the exposure light. In general exposure, the medium through which exposure light passes is air, which has a refraction index "n" of 1, and thus the maximum numerical aperture (NA) of the projection lens (reducing projection lens) 6 is theoretically less than 1.0; in fact, the NA is around 0.9 ($\theta$=65°) at a maximum. Meanwhile, the immersion exposure device 5 adopts as the medium 8 a liquid with a refraction index of greater than 1. Thus "n" increases and the minimum resolvable dimension can therefore be reduced by a factor of "n" provided the incident angle of the exposure light "$\theta$" is constant and, provided that the NA is constant, "$\theta$" can be reduced and therefore the focal depth can be increased by a factor of "n." For example, when purified water is used as the medium 8, the refraction index of the medium 8 is 1.44 in a case of an ArF laser. In this way the NA can be increased as much as 1.44 times, thereby enabling the formation of a finer pattern.

Figure 4:
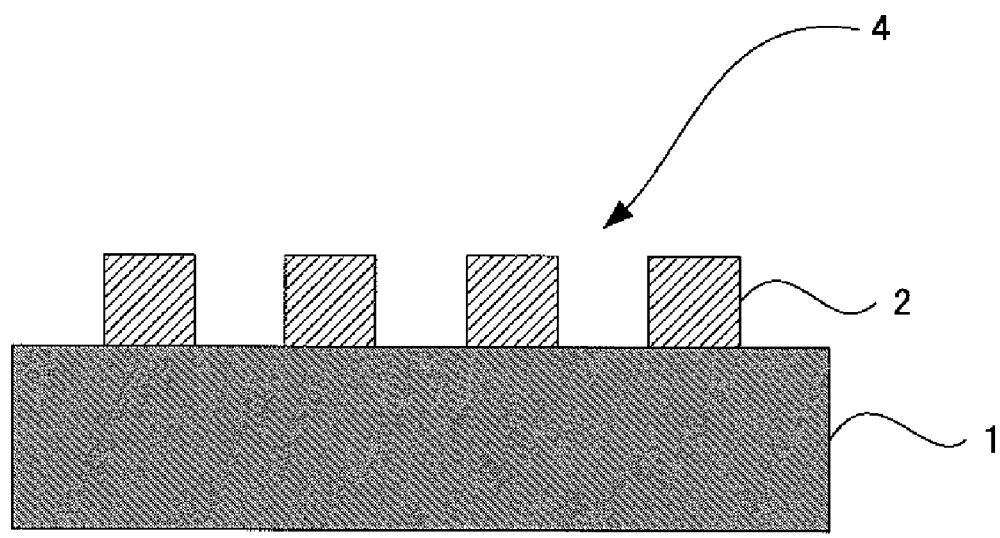
FIG. 4 is a schematic view for explaining an example of the resist pattern forming method of the present invention, showing a state where development has been conducted after immersion exposure conducted using the resist cover film.

The workpiece substrate 1 is placed on the wafer stage 7 of the immersion exposure device 5, and the resist film 2 is exposed through the resist cover 3 to exposure light (e.g., an ArF excimer laser) pattern-wise. As shown in FIG. 4, a subsequent alkali development step then develops off both the resist cover film 3 and portions of the resist film 2 that were not exposed to the ArF excimer laser, forming or revealing a resist pattern 4 on the workpiece substrate 1.

Note that the foregoing process is merely an example of the resist pattern forming method of the present invention, where a positive-type resist material to which the ArF excimer laser is applicable is used. Thus, the combination of exposure lights and resist materials is not specifically limited to this, and any combination can be selected according to the intended purpose.

With the resist pattern forming method of the present invention, high-resolution immersion exposure is made possible on the resist film while efficiently protecting it against the liquid without impairing its performance, thereby allowing efficient, easy formation of a fine, high-resolution pattern. For this reason, the resist pattern forming method of the present invention can be suitably used for the manufacture of functional components (e.g., mask patterns, reticle patterns, magnetic heads, liquid crystal displays (LCDs), plasma display panels (PDPs), and surface acoustic wave (SAW) filters), optical components for connection of optical wires, microcomponents (e.g., microactuators), and electronic devices (e.g., semiconductor devices), particularly in the method of the present invention for manufacturing an electronic device.

(Manufacturing Method for Electronic Device)

The method of the present invention for manufacturing an electronic device includes at least a resist pattern forming step and a patterning step, and further includes additional step(s) appropriately selected, where necessary.

<Resist Pattern Forming Step>

The resist pattern forming step includes forming a resist film over a work surface, forming a resist cover film over the resist film by using the resist cover film forming material of the present invention, irradiating the resist film with exposure light through the resist cover film by means of immersion exposure, and developing the resist film. In this step a resist pattern is formed on the work surface.

Details of this resist pattern forming step are identical to those given for the foregoing resist pattern forming method of the present invention.

Examples of the work surface are surface layers of various components constituting an electronic device such as a semiconductor device. Suitable examples are, however, substrates (e.g., silicon wafers) or surfaces thereof, and various oxide films or surfaces thereof.

For the work surface, surfaces of films made of interlayer insulating material with a permittivity of 2.7 or less are preferable. Suitable examples of such films made of interlayer insulating material with a permittivity of 2.7 or less include low permittivity films such as porous silica films and fluorinated resin films.

The descriptions for the method of immersion exposure and the resist pattern are identical to those given above.

<Patterning Step>

The patterning step is a step of patterning the work surface by etching using the resist pattern as a mask (mask pattern or the like)

The etching method is not particularly limited and can be appropriately selected from those known in the art depending on the intended purpose; for example, dry etching is suitably used. The etching condition is not also particularly limited and can be appropriately set depending on the intended purpose.

With the method of the present invention for manufacturing an electronic device, high-resolution immersion exposure is made possible without impairing the performance of the resist film, and a fine, high-resolution resist pattern can be formed efficiently and readily. It is therefore made possible to mass produce high-performance electronic devices having a fine interconnection pattern that has been formed using the resist pattern, e.g., electronic devices including a variety of semiconductor devices such as flash memories, DRAMs, and FRAMs.

EXAMPLES

Hereinafter, Examples of the present invention will be described, which however shall not be construed as limiting the invention thereto.

Example 1

<Preparation of Resist Cover Film Forming Material>

A silicon-containing polymer represented by the following general formula (4) was dissolved in n-butyl alcohol or isobutyl alcohol to prepare a resist cover film forming material (1) for immersion exposure.

general formula (4)

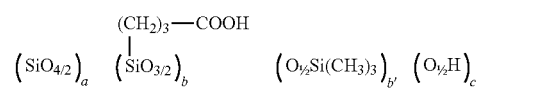

where a=1.2, b=1, b'=0.45, and c=0.08

<Formation of Resist Pattern>

A sample resist material, which is made of alicyclic polymer and for which an ArF excimer laser is used, was applied over a silicon substrate to form a resist film of 250 nm in thickness. Subsequently, the resist cover film forming material (1) was applied over the resist film by spin coating at 2,500 rpm for 30 seconds, followed by baking for 60 seconds on a hot plate set to 110° C. to form an immersion exposure resist cover film of 50 nm in thickness. In this way Sample (1) was prepared Using an immersion exposure device, exposure was conducted on the resist film via the resist cover film. Note that water was adopted as a medium for the immersion exposure and an ArF excimer laser (wavelength=193 nm) was adopted as exposure light. The resist cover film had an ArF excimer laser transmittance of 93% and a refractive index of 1.61. Note, however, that the transmittance value is one obtained for the resist cover film of 100 nm thickness, and this holds true in subsequent Examples and descriptions.

A development operation was then conducted on the resist cover film and the resist film using a 2.38% (by mass) aqueous TMAH to dissolve and remove the resist cover film and unexposed portions of the resist film. As a consequence, it succeeded in obtaining a line/space pattern of 180 nm in width and a hole pattern of 180 nm in diameter at an exposure dose of 33 mJ/cm². Here, the dissolution rate of the resist cover film in the 2.38% (by mass) aqueous TMAH was 750 nm/s.

Example 2

<Preparation of Resist Cover Film Forming Material>

A silicon-containing polymer represented by the following general formula (2) was dissolved in n-butyl alcohol or isobutyl alcohol to prepare a resist cover film forming material (2) for immersion exposure.

general formula (2)

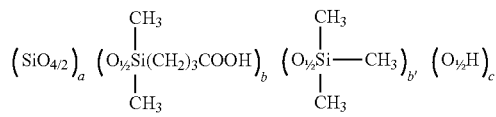

where a=1, b=0.88, b'=0.39, and c=0.05
<Formation of Resist Pattern>

A sample resist material, which is made of alicyclic polymer and for which an ArF excimer laser is used, was applied over a silicon substrate to form a resist film of 250 nm in thickness. Subsequently, the resist cover film forming material (2) was applied over the resist film by spin coating at 2,500 rpm for 30 seconds, followed by baking for 60 seconds on a hot plate set to 110° C. to form an immersion exposure resist cover film of 50 nm in thickness. In this way Sample (2) was prepared.

Using an immersion exposure device, exposure was conducted on the resist film through the resist cover film. Note that water was adopted as a medium for the immersion exposure and an ArF excimer laser (wavelength=193 nm) was adopted as exposure light. The resist cover film had an ArF excimer laser transmittance of 93% and a refractive index of 1.58.

A development operation was then conducted on the resist cover film and the resist film using a 2.38% (by mass) aqueous TMAH to dissolve and remove unexposed portions of the resist film and the resist cover film. As a consequence, it succeeded in obtaining a line/space pattern of 180 nm in width and a hole pattern of 180 nm in diameter at an exposure dose of 33 mJ/cm². The dissolution rate of the resist cover film in the 2.38% (by mass) aqueous TMAH was 900 nm/s.

Example 3

<Preparation of Resist Cover Film Forming Material>

A silicon-containing polymer represented by the following general formula (5) was dissolved in n-butyl alcohol or isobutyl alcohol to prepare a resist cover film forming material (3) for immersion exposure.

general formula (5)

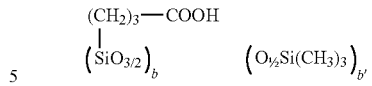

where b=1, and b'=0.11
<Formation of Resist Pattern>

A sample resist material which is made of alicyclic polymer and for which an ArF excimer laser is used, was applied over a silicon substrate to form a resist film of 250 nm in thickness. Subsequently, the resist cover film forming material (3) was applied over the resist film by spin coating at 2,500 rpm for 30 seconds, followed by baking for 60 seconds on a hot plate set to 110° C. to form an immersion exposure resist cover film of 50 nm in thickness. In this way Sample (3) was prepared.

Using an immersion exposure device, exposure was conducted on the resist film via the resist cover film. Note that water was adopted as a medium for the immersion exposure and an ArF excimer laser (wavelength=193 nm) was adopted as exposure light. The resist cover film had an ArF excimer laser transmittance of 92% and a refractive index of 1.61.

A development operation was then conducted on the resist cover film and the resist film using a 2.38% (by mass) aqueous TMAH to dissolve and remove unexposed portions of the resist film and the resist cover film. As a consequence, it succeeded in obtaining a line/space pattern of 180 nm in width and a hole pattern of 180 nm in diameter at an exposure dose of 33 mJ/cm². The dissolution rate of the resist cover film in the 2.38% (by mass) aqueous TMAH was 630 nm/s.

Reference Experiments 1 to 3

Three resist film samples were prepared as in Examples 1 to 3 by forming a resist film on a silicon substrate and forming a resist cover film thereon. The resist film samples were exposed to an ArF excimer laser and developed as in Examples 1 to 3 except that air was used in stead of water as an immersion exposure medium. It succeeded in obtaining a line/space pattern of 180 nm in width and a hole pattern of 180 nm in diameter in every sample at an exposure dose of 33 mJ/cm².

It was established from Reference Experiments that the resist cover films formed by using the resist cover film forming materials (1) to (3) successfully reduced the influence of the problems associated with immersion exposure, such as elution of resist film ingredients in water—an immersion exposure medium—and infiltration of water in the resist film, and made patterning possible without impairing the original resist performance.

Reference Experiment 4

A resist film was prepared as in Examples 1 to 3 except that no resist cover film was formed thereon, and the resist film was exposed to an ArF excimer laser and developed as in Examples 1 to 3 except that air was used in stead of water as an immersion exposure medium. It succeeded in obtaining a line/space pattern of 180 nm in width and a hole pattern of 180 nm in diameter at an exposure dose of 33 mJ/cm².

It was established from Reference Experiment 4 that all of the resist cover film forming materials (1) to (3) were cover film materials capable of sufficiently admitting an ArF excimer laser and of enabling exposure without impairing the original resist performance.

Comparative Example 1

A resist film was prepared as in Examples 1 to 3 except that no resist cover film was formed thereon, and the resist film was exposed to an ArF excimer laser and then developed. It failed in obtaining neither a line/space pattern of 180 nm in width nor a hole pattern of 180 nm in diameter at an exposure dose of 33 mJ/cm$^2$, and the sensitivity of the resist film to the exposure light was reduced compared to those in Examples 1 and 2. Note that "it failed in obtaining a line/space pattern" means that it failed in obtaining a pattern of lines and spaces where the line width-to-space width ratio is not 1:1.

The results of Examples, Reference Experiments, and Comparative Example are shown in Table 1. Note in Table 1 that the symbol "Y" means that resolution was possible and the symbol "N" means that resolution failed, and "L/S" denotes "line/space."

on a hot plate set to 110° C. to form an immersion exposure resist cover film of 50 nm in thickness. In this way Sample (4) was prepared.

Using an immersion exposure device, exposure was conducted on the resist film via the resist cover film. Note that water was adopted as a medium for the immersion exposure and an ArF excimer laser (wavelength=193 nm) was adopted as exposure light. The resist cover film had an ArF excimer laser transmittance of 83% and a refractive index of 1.65.

A development operation was then conducted on the resist cover film and the resist film using a 2.38% (by mass) aqueous TMAH to dissolve and remove unexposed portions of the resist film and the resist cover film. As a consequence, it succeeded in obtaining a line/space pattern of 180 nm in width and a hole pattern of 180 nm in diameter at an exposure dose of 33 mJ/cm$^2$. The dissolution rate of the resist cover film in the 2.38% (by mass) aqueous TMAH was 500 nm/s.

TABLE 1

|  | Cover Film Forming Material | Exposure Medium | L/S Resolution | Hole Resolution |
|---|---|---|---|---|
| Ex. 1 | Cover Film Forming Material (1) | Water | Y | Y |
| Ex. 2 | Cover Film Forming Material (2) | Water | Y | Y |
| Ex. 3 | Cover Film Forming Material (3) | Water | Y | Y |
| Reference Experiment 1 | Cover Film Forming Material (1) | Air | Y | Y |
| Reference Experiment 2 | Cover Film Forming Material (2) | Air | Y | Y |
| Reference Experiment 3 | Cover Film Forming Material (3) | Air | Y | Y |
| Reference Experiment 4 | Not Provided | Air | Y | Y |
| Compara. Ex. 1 | Not Provided | Water | N (not 1:1 ratio resolution) | N (no holes) |

Example 4

<Preparation of Resist Cover Film Forming Material>

A silicon-containing polymer represented by the following general formula (6) was dissolved in isobutyl alcohol to prepare a resist cover film forming material (4) for immersion exposure.

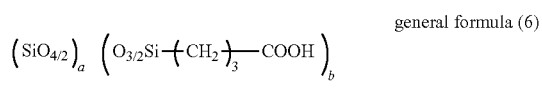

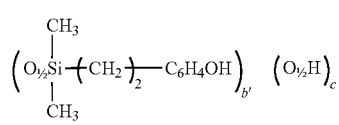

general formula (6)

where a=1, b=0.55, b'=0.11, and c=0.06

<Formation of Resist Pattern>

A sample resist material, which is made of alicyclic polymer and for which an ArF excimer laser is used, was applied over a silicon substrate to form a resist film of 250 nm in thickness. Subsequently, the resist cover film forming material (4) was applied over the resist film by spin coating at 2,500 rpm for 30 seconds, followed by baking for 60 seconds

Example 5

<Preparation of Resist Cover Film Forming Material>

A silicon-containing polymer represented by the following general formula (7) was dissolved in isobutyl alcohol to prepare a resist cover film forming material (5) for immersion exposure.

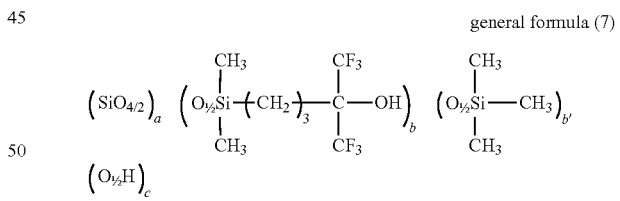

general formula (7)

where a=1, b=0.61, b'=0.22, and c=0.03

<Formation of Resist Pattern>

A sample resist material, which is made of alicyclic polymer and for which an ArF excimer laser is used, was applied over a silicon substrate to form a resist film of 250 nm in thickness. Subsequently, the resist cover film forming material (5) was applied over the resist film by spin coating at 2,500 rpm for 30 seconds, followed by baking for 60 seconds on a hot plate set to 110° C. to form an immersion exposure resist cover film of 50 nm in thickness. In this way Sample (5) was prepared.

Using an immersion exposure device, exposure was conducted on the resist film via the resist cover film. Note that water was adopted as a medium for the immersion exposure and an ArF excimer laser (wavelength=193 nm) was adopted as exposure light. The resist cover film had an ArF excimer laser transmittance of 93% and a refractive index of 1.60.

A development operation was then conducted on the resist cover film and the resist film using a 2.38% (by mass) aqueous TMAH to dissolve and remove unexposed portions of the resist film and the resist cover film. As a consequence, it succeeded in obtaining a line/space pattern of 180 nm in width and a hole pattern of 180 nm in diameter at an exposure dose of 33 mJ/cm$^2$. The dissolution rate of the resist cover film in the 2.38% (by mass) aqueous TMAH was 450 nm/s.

Reference Experiments 4 and 5

Two resist film samples were prepared as in Examples 4 and 5 by forming a resist film on a silicon substrate and forming a resist cover film thereon. The resist film samples were exposed to an ArF excimer laser and developed as in Examples 4 and 5 except that air was used in stead of water as an immersion exposure medium. It succeeded in obtaining a line/space pattern of 180 nm in width and a hole pattern of 180 nm in diameter in every sample at an exposure dose of 33 mJ/cm$^2$.

Example 6

A sample resist material which is made of alicyclic polymer and for which an ArF excimer laser is used, was applied over a 6-inch Si wafer (Shin-Etsu Chemical Co., Ltd.) on which an antireflection film (ARC-39 by Nissan Chemical Industries, Ltd.) had been previously formed. The resist film thus formed was baked at 100° C. for 60 seconds. The thickness of the resist film was 200 nm.

The resist film was washed with 5 ml of ultrapure water to obtain a sample solution. A 5 μl aliquot of the solution was then analyzed using LC-MSD (Agilent Technologies), revealing the presence of 110 ppb negative ions of the acid generation agent that had been eluted from the resist film.

Subsequently, the resist cover film forming material (2) prepared in Example 2 was applied over the resist film by spin coating, and baked for 60 seconds on a hot plate set to 110° C. to form a resist cover film of 50 nm thickness for immersion exposure. A similar washing experiment using ultrapure water was performed on the resist film. It was confirmed that the level of negative ions of the acid generation agent eluted from the resist film was below the detection limit and thus that the resist cover film forming material (2) offered excellent capability of preventing elution of negative ions from the resist film.

Example 7

A sample coated with sample resist material which is made of alicyclic polymer and for which an ArF excimer laser is used, and a sample coated with the resist cover film forming material (2) were prepared. The receding contact angle (dynamic contact angle) of each of the samples was measured using a self-made measurement instrument.

More specifically, a sample-coated Si wafer was secured on a tilt stage that is continuously adjustable in tilt angle, followed by application of one drop (50 μl) of water on the sample surface. Immediately after this water drop application, the stage was tilted at a constant speed, and the receding contact angle was measured based on the shape of the droplet observed a certain time after it started moving.

The receding contact angle was 610 for the sample coated with the sample resist material, and 80° for the sample coated with the resist cover film forming material (2). It was confirmed from this result that the resist cover film forming material (2) was a material that is effective in reducing the occurrence of watermark defects and increasing the scanning speed for exposure.

Example 8

Figure 5:
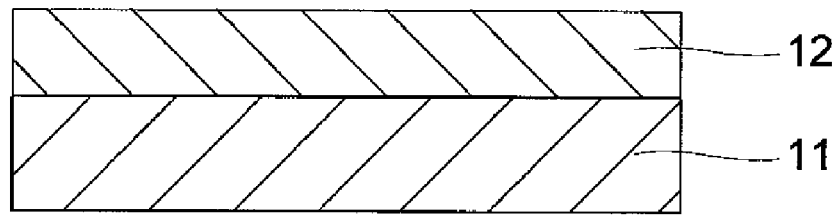
FIG. 5 is a schematic view for explaining an example of the method of the present invention for manufacturing an electronic device, showing a state where an interlayer insulating film has been formed on a silicon substrate.
Figure 6:
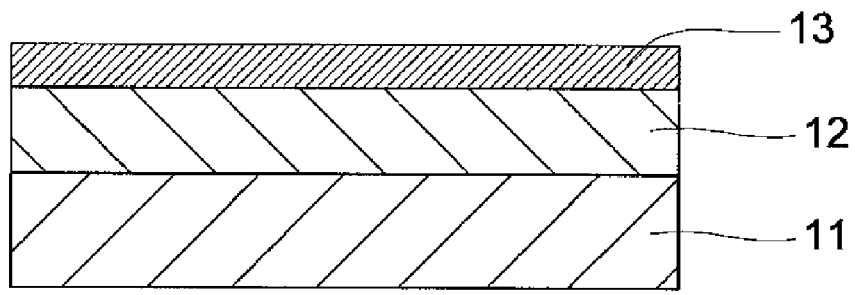
FIG. 6 is a schematic view for explaining an example of the method of the present invention for manufacturing an electronic device, showing a state where a titanium film has been formed on the interlayer insulating film shown in FIG. 5.
Figure 7:
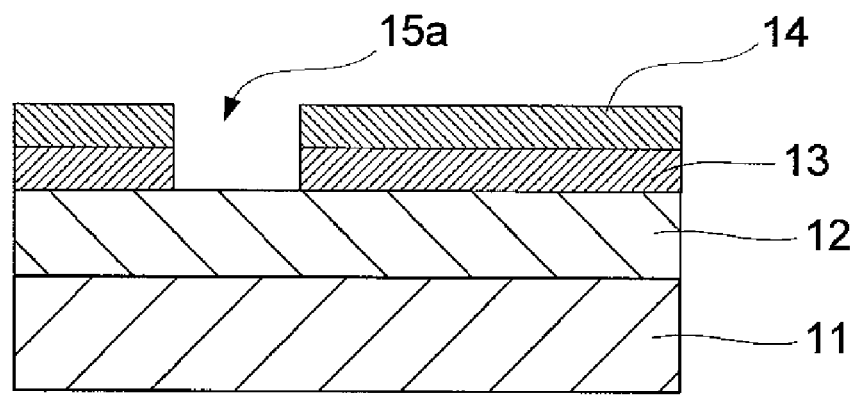
FIG. 7 is a schematic view for explaining an example of the method of the present invention for manufacturing an electronic device, showing a state where a resist film has been formed on the titanium film and a hole pattern has been formed in the titanium film.
Figure 8:
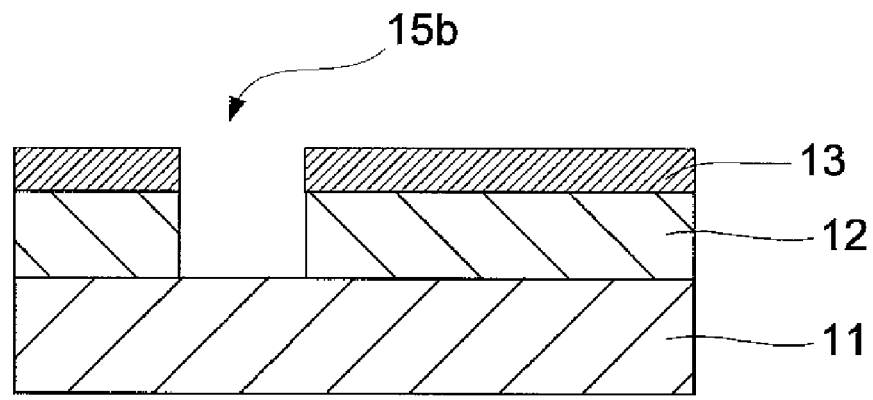
FIG. 8 is a schematic view for explaining an example of the method of the present invention for manufacturing an electronic device, showing a state where the hole pattern has been formed also in the interlayer insulating film.

As shown in FIG. 5, an interlayer insulating film 12 was formed on a silicon substrate 11 and, as shown in FIG. 6, a titanium film 13 was formed on the interlayer insulating film 12 by sputtering. As shown in FIG. 7, a resist pattern 14 was formed by means of immersion exposure that utilizes known photolithography, and the titanium film 13 was patterned by reactive ion etching using the resist pattern 14 as a mask to thereby form an opening 15*a* therein. Subsequently, while removing the resist pattern 14 by reactive ion etching, an opening 15*b* was formed in the interlayer insulating film 12 using the titanium film 13 as a mask, as shown in FIG. 8.

Figure 9:
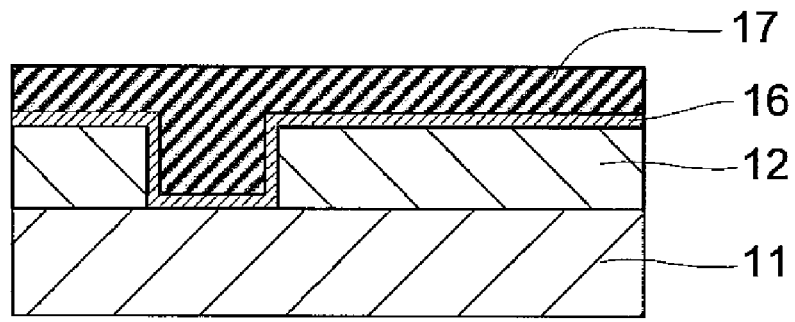
FIG. 9 is a schematic view for explaining an example of the method of the present invention for manufacturing an electronic device, showing a state where a Cu film has been formed on the interlayer insulating having the hole pattern formed therein.
Figure 10:
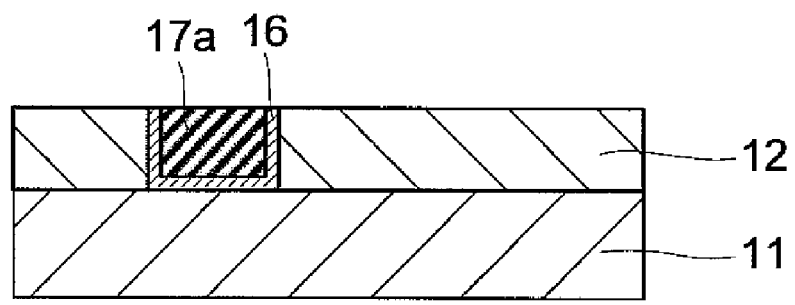
FIG. 10 is a schematic view for explaining an example of the method of the present invention for manufacturing an electronic device, showing a state where Cu has been removed from the interlayer insulating film except in the hole pattern.

The titanium film 13 was then removed by wet processing and, as shown in FIG. 9, a TiN film 16 was formed on the interlayer insulating film 12 by sputtering. A Cu film 17 was deposited on the TiN film 16 by electroplating. As shown in FIG. 10, the Cu film 17 (first metal film) and the barrier metal layer were removed by CMP while leaving the Cu film 17 and the barrier metal layer that are present in a trench corresponding to the opening 15*b* (see FIG. 8) intact. In this way a first interconnection layer 17*a* was formed.

Figure 11:
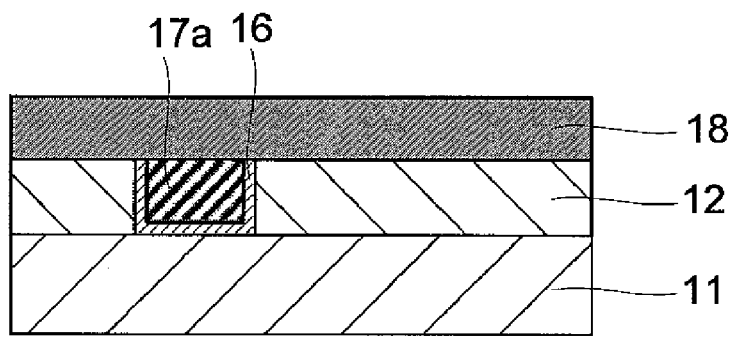
FIG. 11 is a schematic view for explaining an example of the method of the present invention for manufacturing an electronic device, showing a state where another interlayer insulating film has been formed both on the Cu plug formed in the hole pattern and the interlayer insulating film.
Figure 12:
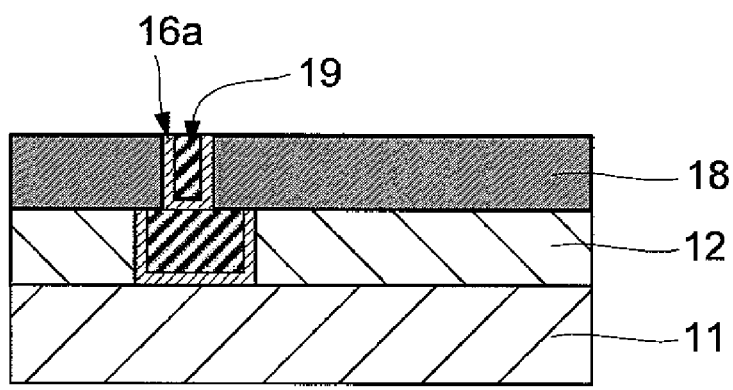
FIG. 12 is a schematic view for explaining an example of the method of the present invention for manufacturing an electronic device, showing a state where a hole pattern has been formed in the upper interlayer insulating film followed by formation of a Cu plug therein.

After forming an interlayer insulating film 18 on the first interconnection layer 17*a* as shown in FIG. 11, a Cu plug (second metal film) 19 and a TiN film 16*a*, both of which serve to connect the first interconnection layer 17*a* to another interconnection layer to be formed above, were formed in a manner similar to those shown in FIGS. 5 to 10, as shown in FIG. 12.

Figure 13:
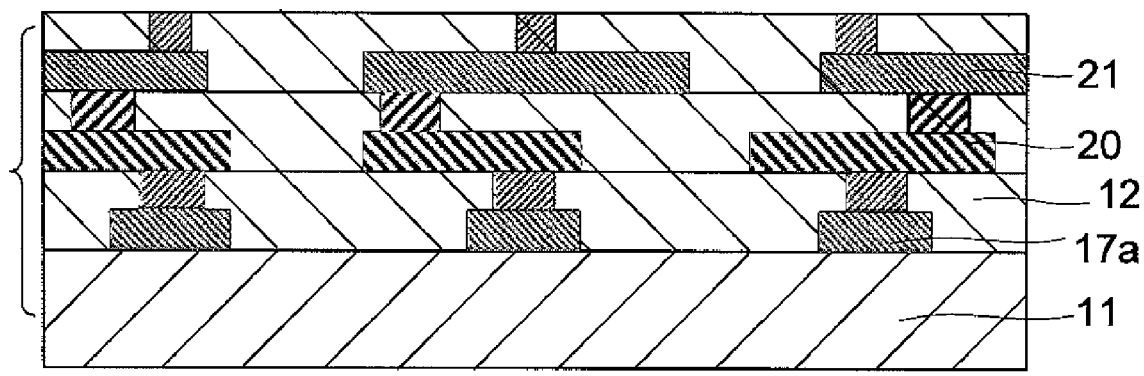
FIG. 13 is a schematic view for explaining an example of the method of the present invention for manufacturing an electronic device showing a state where interconnection of three levels has been formed.

By repeating this process, as shown in FIG. 13, a semiconductor device was manufactured that has a multilayer interconnection structure having the first interconnection layer 17*a*, a second interconnection layer 20 and a third interconnection layer 21 over the silicon substrate 11. Note in FIG. 13 that the barrier metal layer formed at the bottom of each interconnection layer is not illustrated.

The resist pattern 14 of Example 8 is a resist pattern prepared in a manner similar to those described Examples 1 to 5, where the resist cover film forming material (2) was used upon immersion exposure.

The interlayer insulating film 12 is a low permittivity film with a permittivity of 2.7 or less; examples include a porous silica film ("Ceramate NCS" by Catalysts & Chemicals Industries Co., Ltd., permittivity=2.25); and a fluorocarbon film (permittivity=2.4) prepared by depositing a mixture gas of $C_4F_8$ and $C_2H_2$ or $C_4F_8$ gas as a source by RF-CVD (power=400 W).

Example 9

-Flash Memory and its Manufacture-

Example 9 shows an example of the method of the present invention for manufacturing an electronic device, which the method uses the resist cover film forming material of the present invention. Note in Example 9 that the resist films 26, 27, 29, and 32 described below are ones prepared in a manner similar to those described in Examples 1 to 5 where the resist cover film forming material of the present invention was used.

Figure 14:
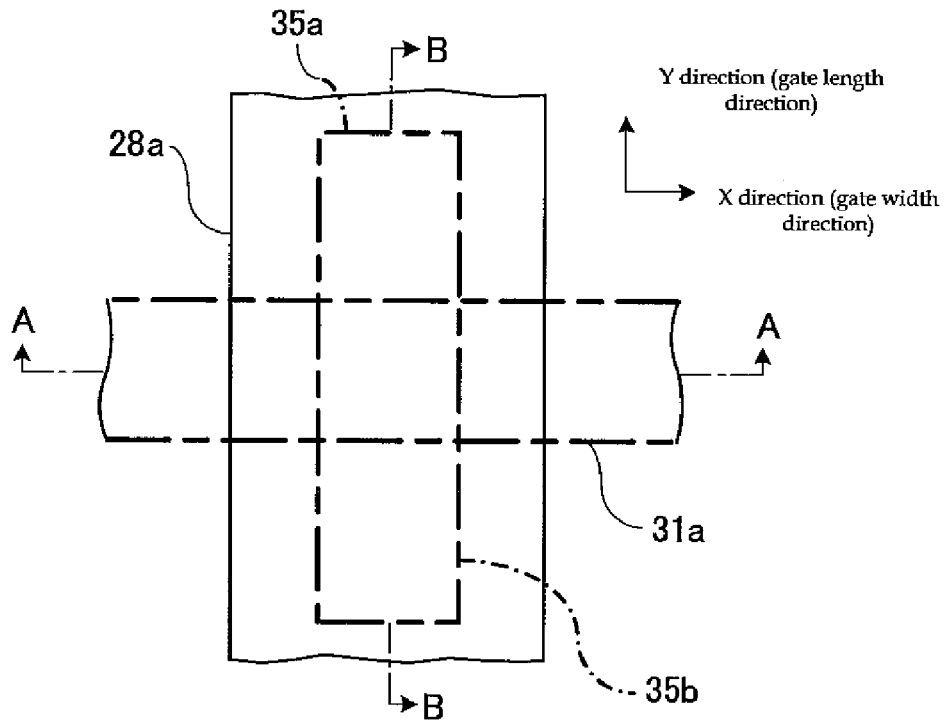
FIG. 14 is a plan view showing a first example of a FLASH EPROM manufactured by the method of the present invention for manufacturing an electronic device.
Figure 15:
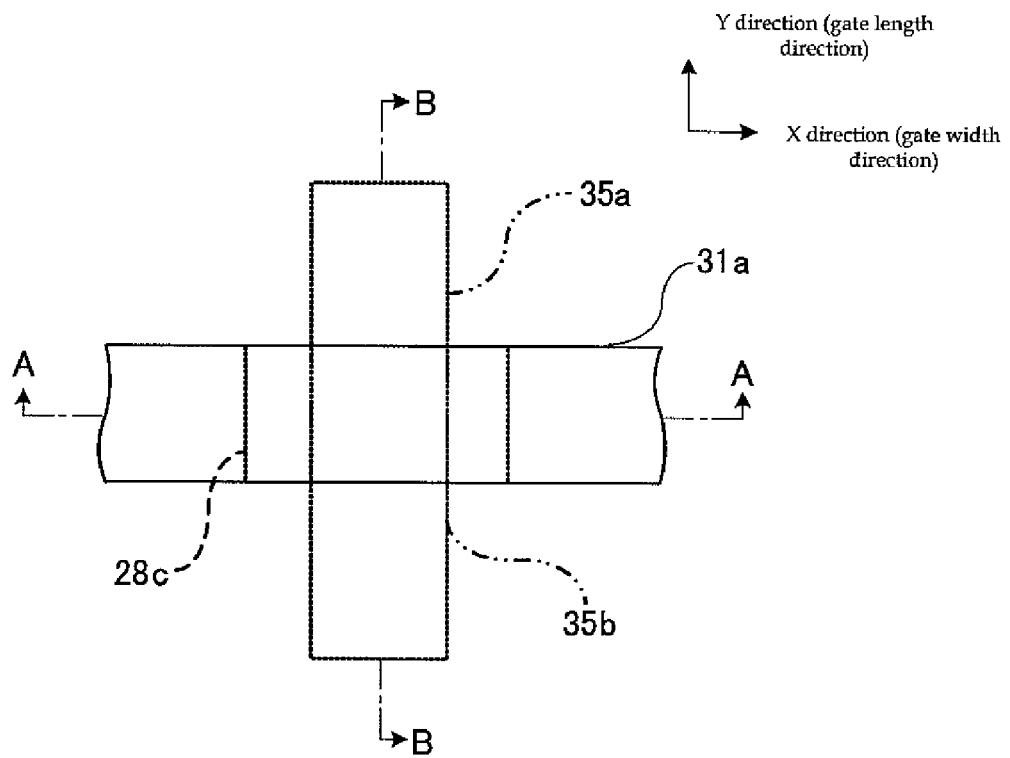
FIG. 15 is another plan view of the first example of a FLASH EPROM manufactured by the method of the present invention for manufacturing an electronic device.

FIGS. 14 and 15 are each a top (plan) view of a FLASH EPROM called FLOTOX type or ETOX type. FIGS. 16 to 24 are schematic sectional views for explaining an example of the method of manufacturing the FLASH EPROM. The left view in each of FIGS. 16 to 24 illustrates a memory cell part (first element region), showing a schematic sectional view of a portion to be provided with a MOS transistor having a floating gate electrode the schematic sectional view being taken along the A-A line of the gate width direction (X direction in FIGS. 14 and 15); the central view illustrates the memory cell part corresponding to that shown in the left view, showing a schematic sectional view taken along the B-B line of the gate length direction (Y direction in FIGS. 14 and 15) that is orthogonal to the X direction; and the right view is a schematic sectional view of a portion of a peripheral circuitry part (second element region) to be provided with a MOS transistor, the schematic sectional view being taken along the A-A line in FIGS. 14 and 15.

Figure 16:
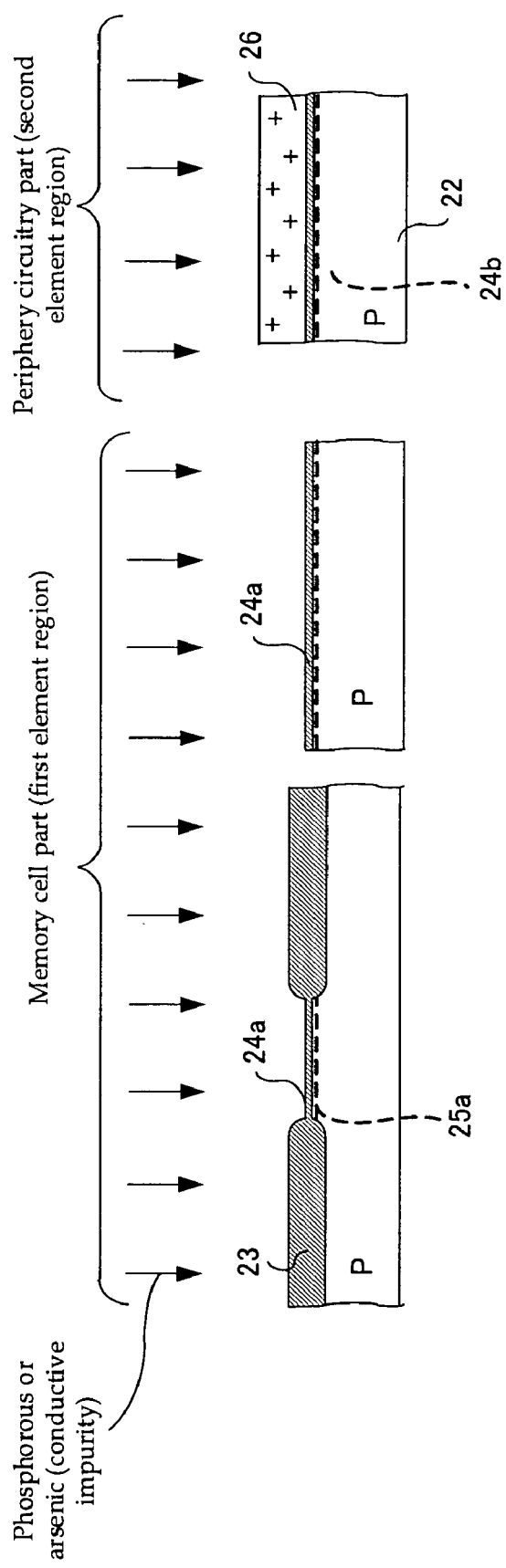
FIG. 16 is a schematic explanatory diagram of a first example of the manufacture of a FLASH EPROM by using the method of the present invention for manufacturing an electronic device.
Figure 17:
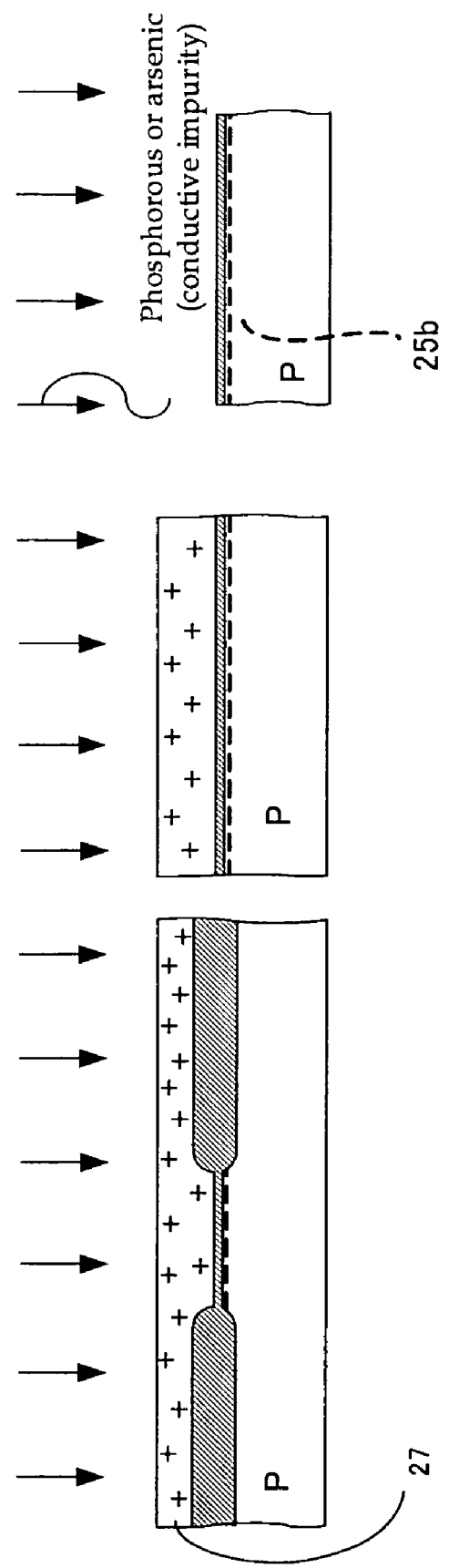
FIG. 17 is a schematic explanatory diagram of a first example of the manufacture of a FLASH EPROM by using the method of the present invention for manufacturing an electronic device, showing a step conducted after the step shown in FIG. 16.
Figure 18:
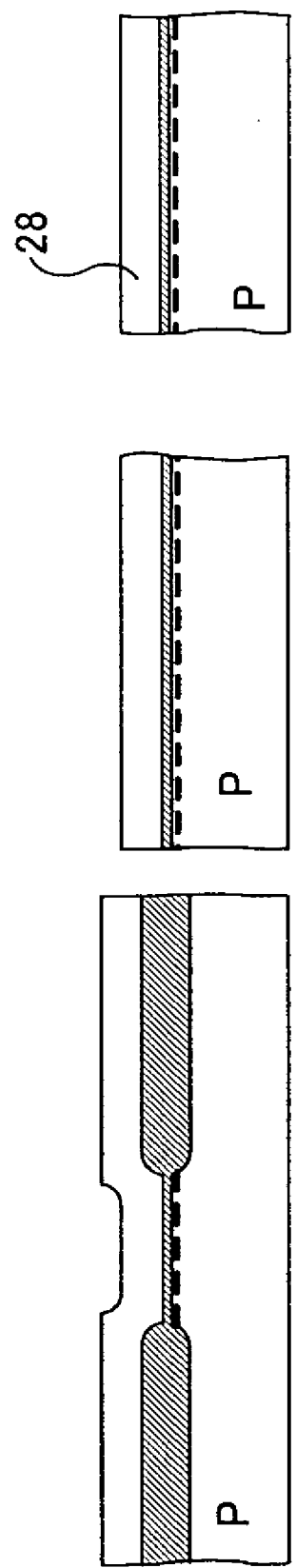
FIG. 18 is a schematic explanatory diagram of a first example of the manufacture of a FLASH EPROM by using the method of the present invention for manufacturing an electronic device, showing a step conducted after the step shown in FIG. 17.

Firstly, as shown in FIG. 16, a field oxide film 23 formed of a $SiO_2$ film was formed on the selected portions of the element separation region of a p-type Si substrate 22. Thereafter, a $SiO_2$ film was formed by thermal oxidation in the MOS transistor in the memory cell part (first element region) to form a first gate insulating film 24a of 100 Å to 300 Å (10 nm to 30 nm) thickness. In another step a $SiO_2$ film was formed by thermal oxidation in the MOS transistor present in the periphery circuitry part (second element region) to form a second gate insulating film 24b of 100 Å to 500 Å (10 nm to 50 nm) thickness. In a case where the first and second gate insulating films 24a and 24b are to have the same thickness, the oxide films may be formed simultaneously in the same step.

In order to form a MOS transistor with an n-type depletion channel in the memory cell part (the left and center views of FIG. 16), the periphery circuitry part (the right view of FIG. 16) was masked with a resist film 26 so as to control the threshold voltage. The region to be a channel region directly under a floating gate electrode was doped with phosphorous (P) or arsenic (As) as an n-type impurity at a dose amount of $1\times10^{11}$ cm$^{-2}$ to $1\times10^{14}$ cm$^{-2}$ by means of ion implantation, forming a first threshold controlling layer 25a. Note that the doping concentration and the conductivity type of the impurity can be appropriately determined according to the channel type—depletion type or accumulation type.

In order to form a MOS transistor with an n-type depletion channel in the periphery circuitry part (the right view of FIG. 17), the memory cell part (the left and center views of FIG. 17) was masked with a resist film 27 so as to control the threshold voltage. The region to be a channel region directly under the floating gate electrode was doped with phosphorous (P) or arsenic (As) as an n-type impurity at a dose amount of $1\times10^{11}$ cm$^{-2}$ to $1\times10^{14}$ cm$^{-2}$ by means of ion implantation, forming a second threshold controlling layer 25b.

A first polysilicon film (first conductive film) 28 of 500 Å to 2,000 Å (50 nm to 200 nm) thickness was formed over both the memory cell part (the left and center views of FIG. 18) and the periphery circuitry part (the right view of FIG. 18) so as to serve as a floating gate electrode of the MOS transistor in the memory cell part and as a gate electrode of the MOS transistor in the periphery circuitry part.

Figure 19:
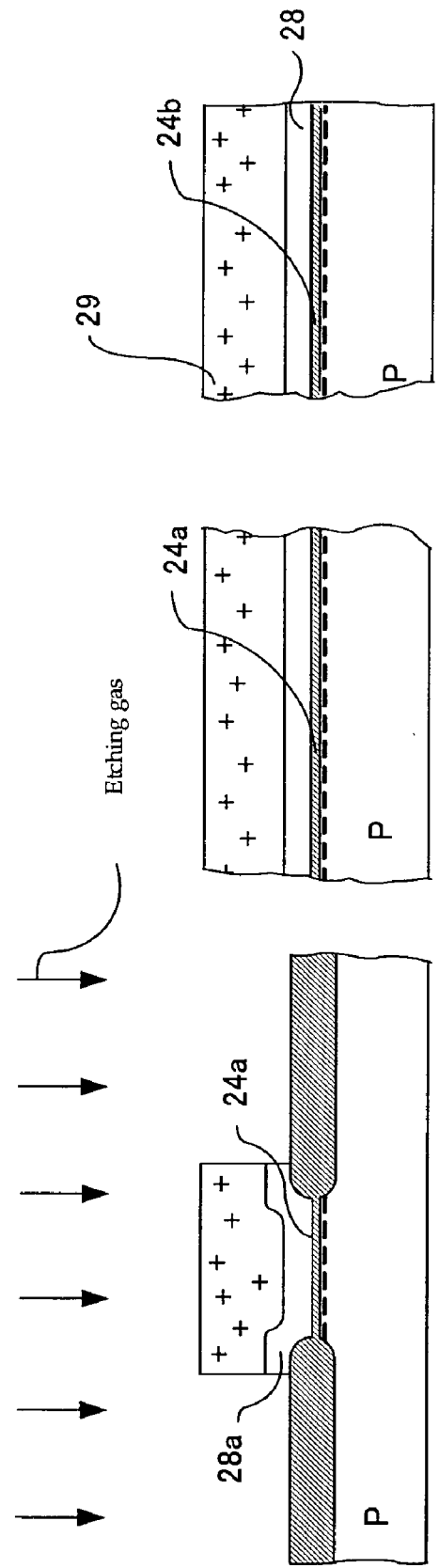
FIG. 19 is a schematic explanatory diagram of a first example of the manufacture of a FLASH EPROM by using the method of the present invention for manufacturing an electronic device, showing a step conducted after the step shown in FIG. 18.

Subsequently, as shown in FIG. 19, the first polysilicon film 28 was patterned using a resist film 29 as a mask to form a floating gate electrode 28a of the MOS transistor in the memory cell part (the left and center views of FIG. 19). At this point, as shown in FIG. 19, the first polysilicon film 28 was patterned in such a manner that the final dimension of the floating gate electrode 28a is defined only in X direction, with the dimension in Y direction left undetermined and with the region to be an S/D region left covered with the resist film 29.

Figure 20:
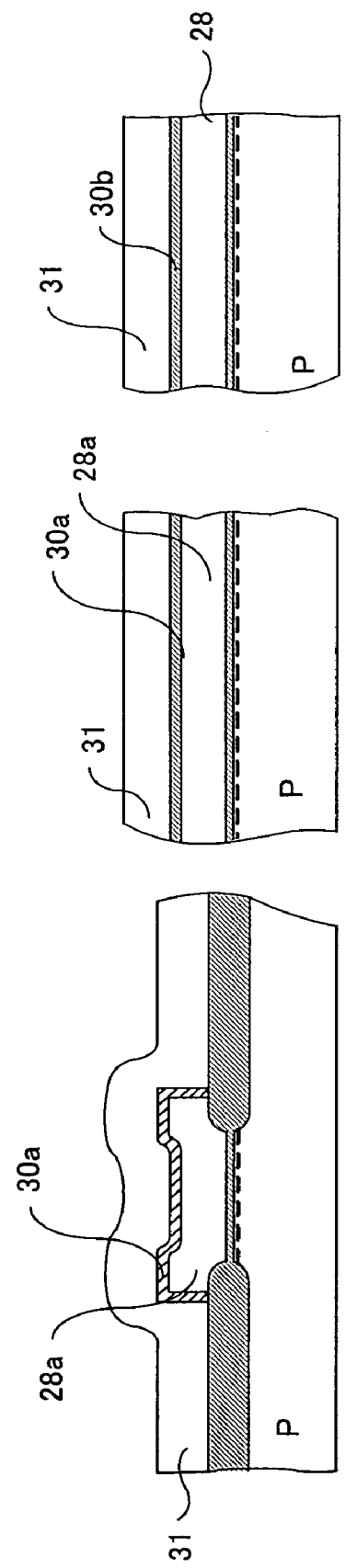
FIG. 20 is a schematic explanatory diagram of a first example of the manufacture of a FLASH EPROM by using the method of the present invention for manufacturing an electronic device, showing a step conducted after the step shown in FIG. 19.

Next, as shown in the left and central views of FIG. 20, the resist film 29 was removed and then a capacitor insulating film 30a formed of a $SiO_2$ film of about 200 Å to 500 Å (20 nm to 50 nm) thickness was formed by thermal oxidation so as to cover the floating gate electrode 28a. At this point, a capacitor insulating film 30b formed of a $SiO_2$ film was formed also on the first polysilicon film 28 in the periphery circuitry part (the right view of FIG. 20). Although both the capacitor insulating films 30a and 30b were formed only of a $SiO_2$ film in this particular case, they may be formed of a composite film having two or three $SiO_2$ film(s) and/or $Si_3N_4$ film(s) stacked on top of each other.

As shown in FIG. 20, a second polysilicon film (second conductive film) 31 of 500 Å to 2,000 Å (50 nm to 200 nm) thickness, which would constitute a control gate electrode, was formed so as to cover the floating gate electrode 28a and the capacitor insulating film 30a.

Figure 21:
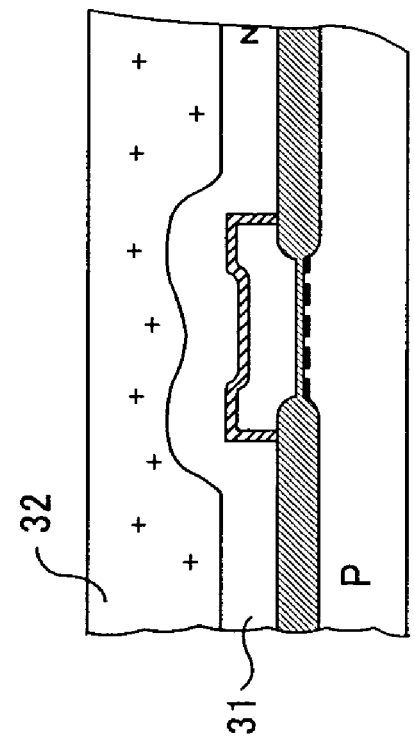
FIG. 21 is a schematic explanatory diagram of a first example of the manufacture of a FLASH EPROM by using the method of the present invention for manufacturing an electronic device, showing a step conducted after the step shown in FIG. 20.
Figure 21:
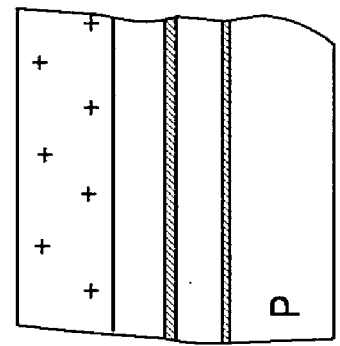
Figure 21:
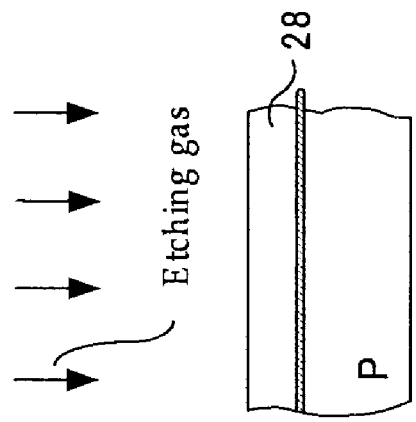

The memory cell part (left and center views of FIG. 21) was then masked with a resist film 32 as shown in FIG. 21, and the second polysilicon film 31 and the capacitor insulating film 30b in the periphery circuitry part (the right view of FIG. 21) were sequentially etched away, revealing the first polysilicon film 28.

Figure 22:
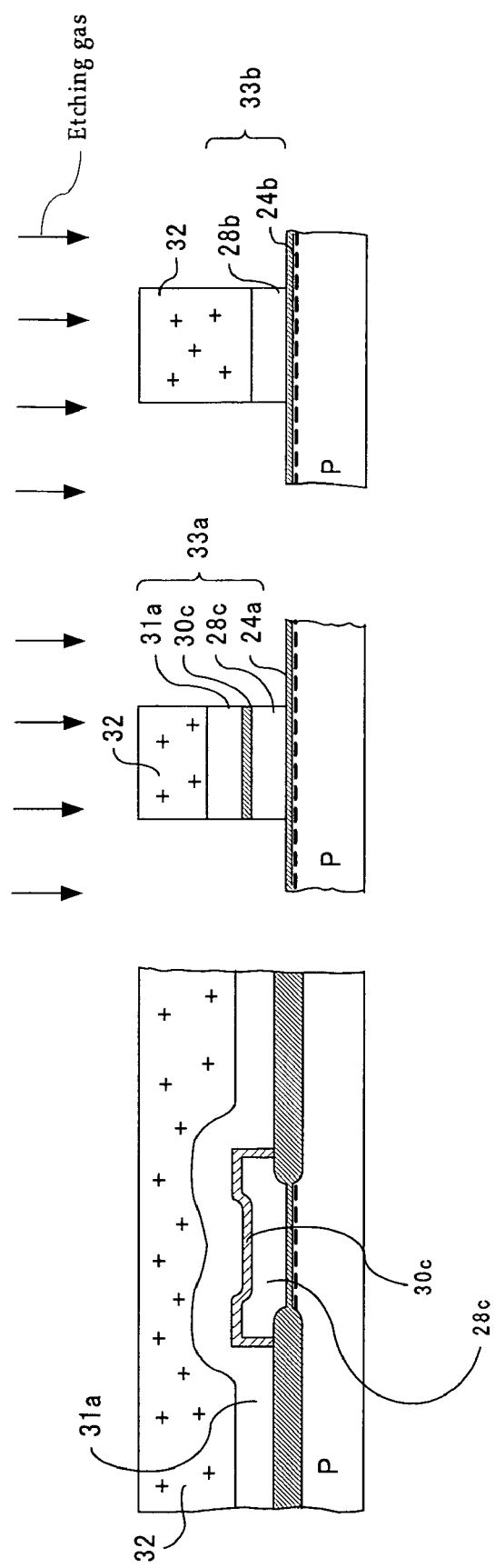
FIG. 22 is a schematic explanatory diagram of a first example of the manufacture of a FLASH EPROM by using the method of the present invention for manufacturing an electronic device, showing a step conducted after the step shown in FIG. 21.
Figure 23:
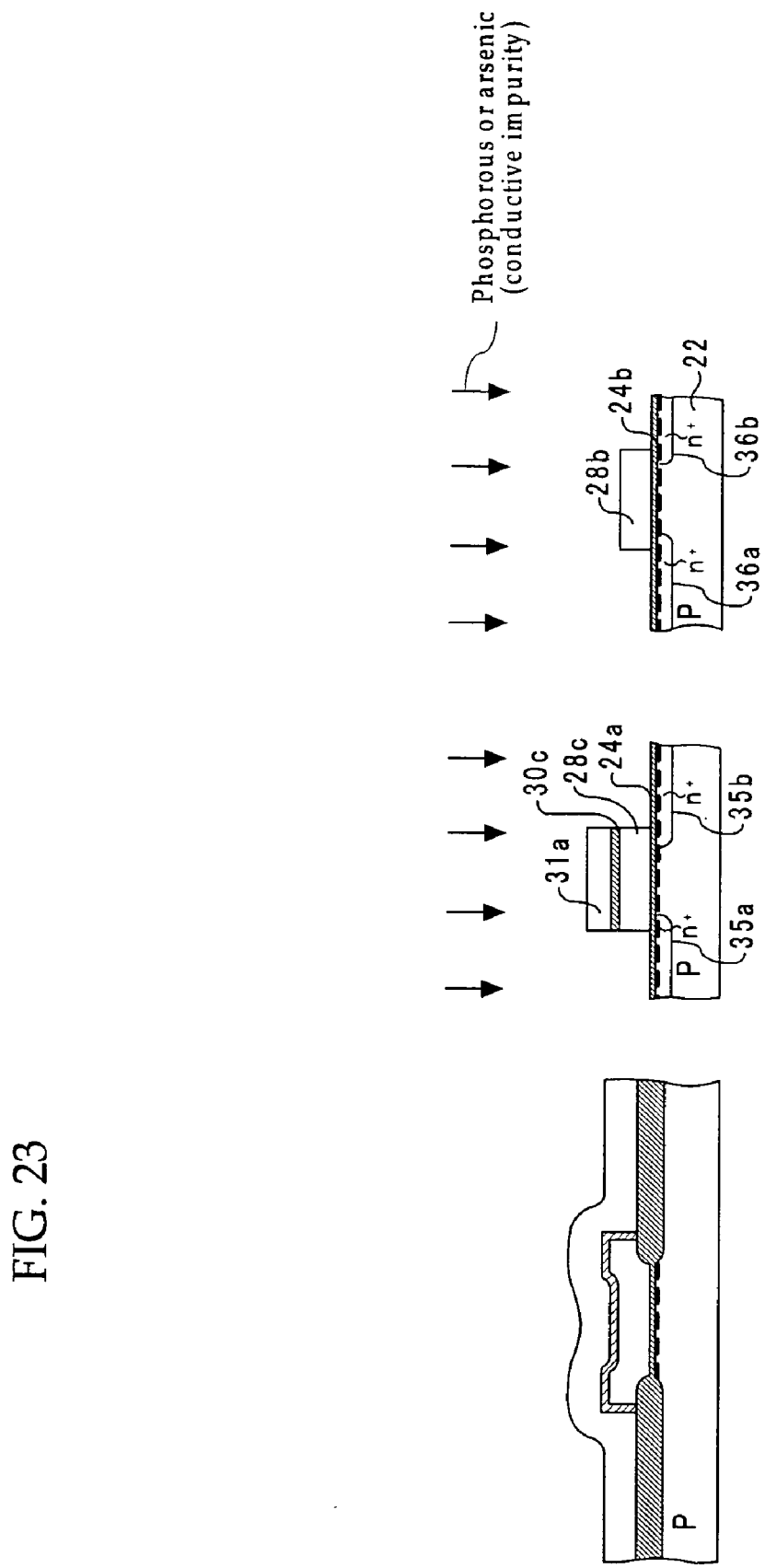
FIG. 23 is a schematic explanatory diagram of a first example of the manufacture of a FLASH EPROM by using the method of the present invention for manufacturing an electronic device, showing a step conducted after the step shown in FIG. 22.

Next, as shown in FIG. 22, the second polysilicon film 31, the capacitor insulating film 30a and the first polysilicon film 28a patterned in such a manner that the final dimension of the first polysilicon film 28a is defined only in X direction, all of which are arranged in the memory cell part (the center and left views of FIG. 22), were masked with a resist film 32 and patterned so as to define the final dimension of a first gate part 33a in Y direction, forming a laminate that is about 1 μm in Y direction and composed of a control gate electrode 31a, a capacitor insulating film 30c and a floating gate electrode 28c. At the same time, the first polysilicon film 28 in the periphery circuitry part (right view of FIG. 22) was masked with the resist film 32 and patterned so as to define a final dimension of a second gate part 33b, forming a gate electrode 28b of about 1 μm in width.

Using as a mask the laminate that is provided in the memory cell part (left and center views of FIG. 23) and composed of the control gate electrode 31a, capacitor insulating film 30c and floating gate electrode 28c, the Si substrate 22 was doped with phosphorous (P) or arsenic (As) at a dose amount of $1\times10^{14}$ cm$^{-2}$ to $1\times10^{16}$ cm$^{-2}$ by means of ion implantation, forming n-type S/D region layers 35a and 35b in element formation regions. At the same time, using as a mask the gate electrode 28b in the periphery circuitry part (right view of FIG. 23), the Si substrate 22 was doped with phosphorous (P) or arsenic (As) as an n-type impurity at a dose amount of $1\times10^{14}$ cm$^{-2}$ to $1\times10^{16}$ cm$^{-2}$ by means of ion implantation, forming S/D region layers 36a and 36b in element formation regions.

Figure 24:
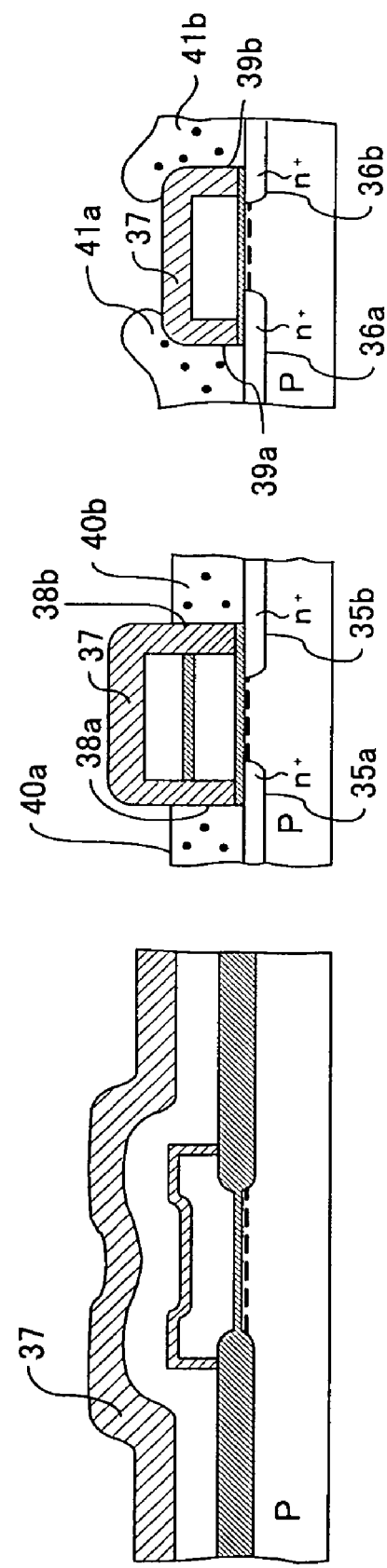
FIG. 24 is a schematic explanatory diagram of a first example of the manufacture of a FLASH EPROM by using the method of the present invention for manufacturing an electronic device, showing a step conducted after the step shown in FIG. 23.

An interlayer insulating film 37 formed of a PSG film of about 5,000 Å (500 nm) thickness was formed so as to cover the first gate part 33a in the memory cell part (the left and center views of FIG. 24) and the second gate part 33b in the periphery circuitry part (the right view of FIG. 24)

In the interlayer insulating film 37 formed over the S/D region layers 35a and 35b and the S/D region layers 36a and 36b, contact holes 38a and 38b and contact holes 39a and 39b were respectively formed, followed by formation of S/D electrodes 40a and 40b and S/D electrodes 41a and 41b therein.

In this way a FLASH EPROM was manufactured as a semiconductor device as shown in FIG. 24.

During the manufacture of this FLASH EPROM, the second gate insulating film 24b in the periphery circuitry part (the right views of FIGS. 16 to 24) is kept covered with either the first polysilicon film 28 or the gate electrode 28b from the time of its formation (as shown in the right views of FIGS. 16 to 24). For this reason, the thickness of the second gate insulating film 24b remains unchanged from its formation, allowing easy control of the thickness of the second gate insulating film 24b and easy adjustment of the concentration of conductive impurities for threshold voltage control.

In Examples described above, although patterning was conducted in such a manner that the first gate part 33a is first defined in the gate width direction (X direction shown in FIGS. 14 and 15) to a certain dimension and then the gate length direction (Y direction shown in FIGS. 14 and 15) is defined for forming the first gate part 33a, this may be conducted in reverse order; patterning may be conducted in such a manner that the first gate part 33a is first defined in the gate length direction to a certain dimension and then the final dimension of the first gate part 33a is defined in the gate width direction for forming the first gate part 33a.

Figure 25:
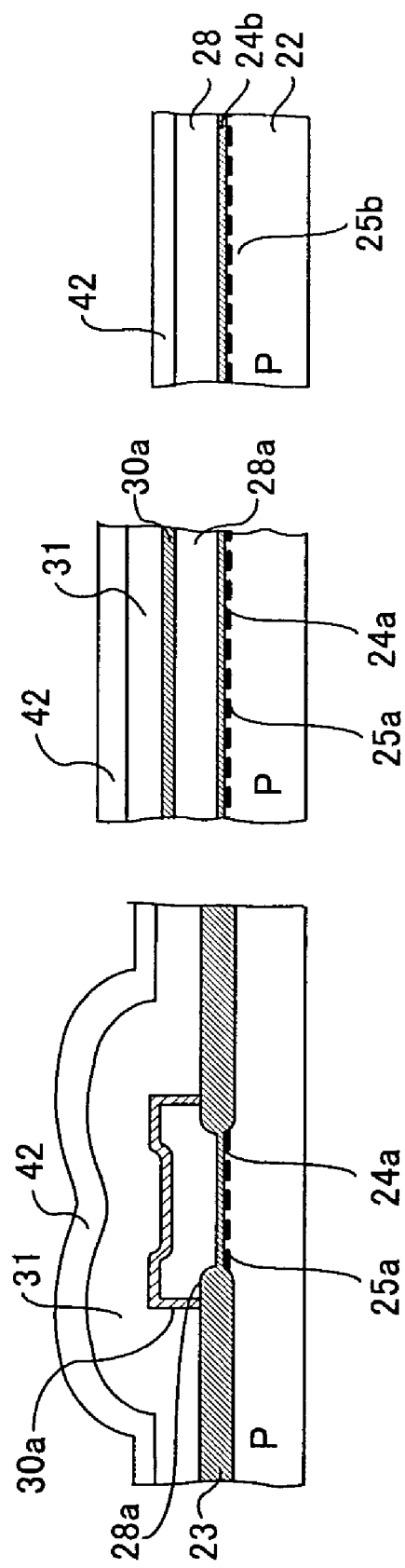
FIG. 25 is a schematic explanatory diagram of a second example of the manufacture of a FLASH EPROM by using the method of the present invention for manufacturing an electronic device.
Figure 26:
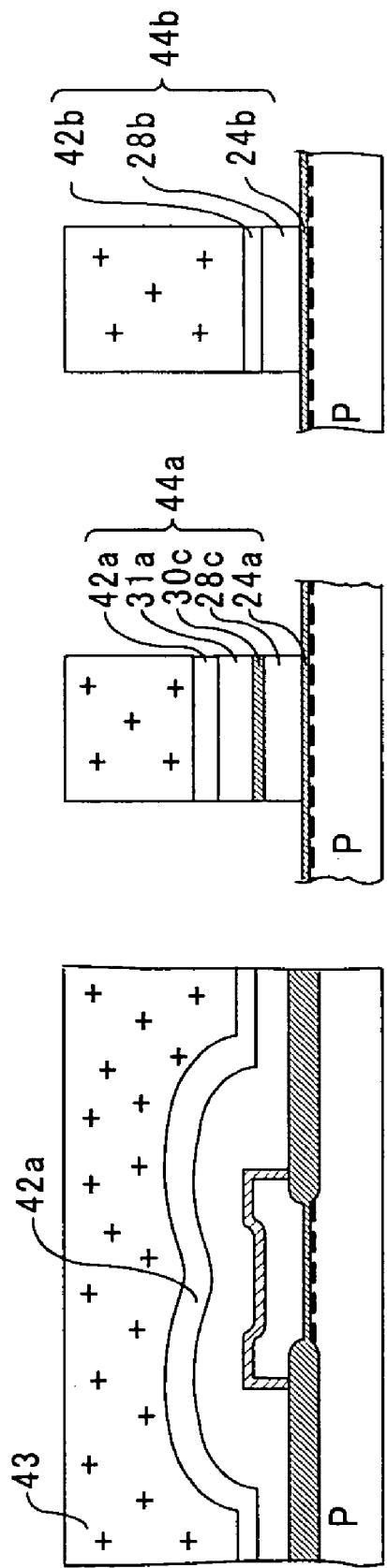
FIG. 26 is a schematic explanatory diagram of a second example of the manufacture of a FLASH EPROM by using the method of the present invention for manufacturing an electronic device, showing a step conducted after the step shown in FIG. 25.
Figure 27:
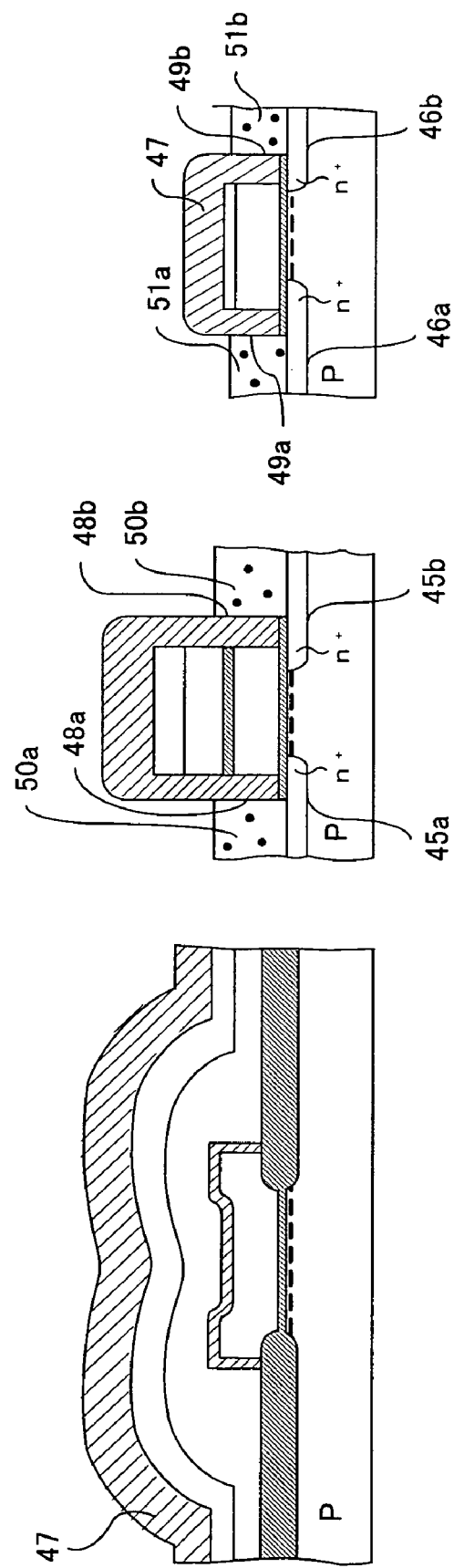
FIG. 27 is a schematic explanatory diagram of a second example of the manufacture of a FLASH EPROM by using the method of the present invention for manufacturing an electronic device, showing a step conducted after the step shown in FIG. 26.

An example of manufacture of a FLASH EPROM shown in FIGS. 25 to 27 is similar to that described in Examples above except that the steps subsequent to the step corresponding to FIG. 20 were changed to those shown in FIGS. 25 to 27. To be more specific, the example of manufacture of a FLASH EPROM shown in FIGS. 25 to 27 differs from Examples described above in that, as shown in FIG. 25, a high-melting point metal film (fourth conductive film) 42 of about 2,000 Å (200 nm) in thickness formed of a tungsten (W) film or titanium (Ti) film is formed over the second polysilicon film 31 in the memory cell part (the left and center views of FIG. 25) and over the first polysilicon film 28 in the periphery circuitry part (the right view of FIG. 25) to provide a polycide film. The steps after FIG. 25—the steps shown in FIGS. 26 and 27—are similar to those shown in FIGS. 22 to 24. Descriptions for the steps that are similar to those shown in FIGS. 22 and 24 are omitted, and members in FIGS. 25 and 27 that are identical to those shown in FIGS. 22 and 24 are given the same reference numerals.

In this way a FLASH EPROM was manufactured as a semiconductor device as shown in FIG. 27.

Because this FLASH EPROM includes high-melting point metal films (fourth conductive films) 42a and 42b respectively provided on the control gate electrode 31a and the gate electrode 28b, the electrical resistance can be further reduced. Although the high-melting point metal films (fourth conductive films) 42a and 42b were used, high-melting point metal silicide films such as titanium silicide (TiSi) films may be used.

Figure 28:
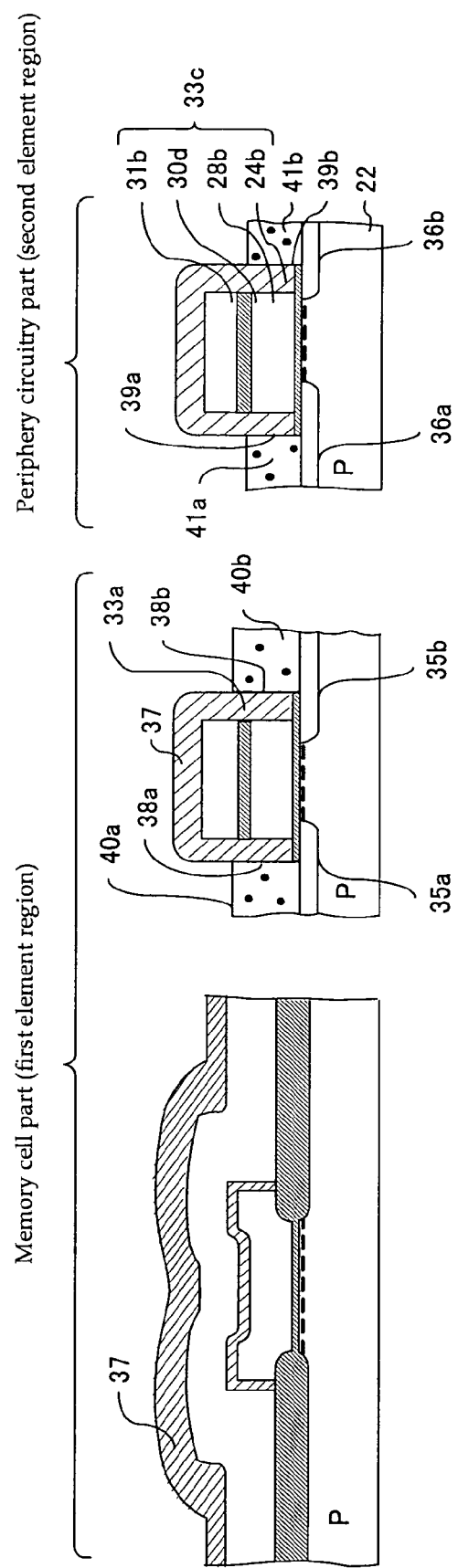
FIG. 28 is a schematic explanatory diagram of a third example of the manufacture of a FLASH EPROM by using the method of the present invention for manufacturing an electronic device.
Figure 29:
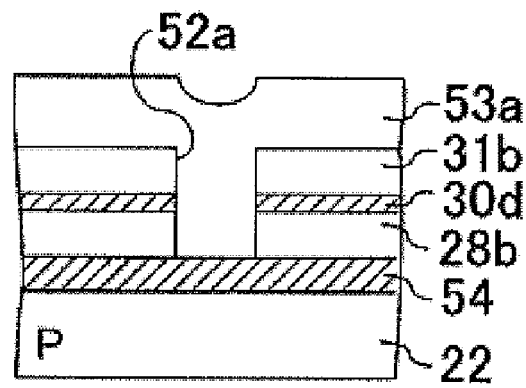
FIG. 29 is a schematic explanatory diagram of a third example of the manufacture of a FLASH EPROM by using the method of the present invention for manufacturing an electronic device, showing a step conducted after the step shown in FIG. 28.
Figure 30:
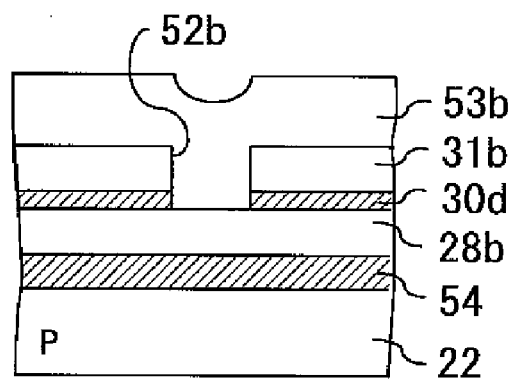
FIG. 30 is a schematic explanatory diagram of a third example of the manufacture of a FLASH EPROM by using the method of the present invention for manufacturing an electronic device, showing a step conducted after the step shown in FIG. 29.

An example of manufacture of a FLASH EPROM shown in FIGS. 28 to 30 is similar to that described in Examples described above except that a second gate part 33c in the periphery circuitry part (second element region in the right view of FIG. 30) is a laminate composed of a first polysilicon film 28b (first conductive film), a SiO₂ film 30d (capacitor insulating film) and a second polysilicon film 31b (second conductive film), a configuration similar to that of the first gate part 33a in the memory cell part (first element region in the left and center views of FIG. 28), and that the first and second polysilicon films 28b and 31b are electrically shorted to form a gate electrode as shown in FIGS. 29 and 30.

Here, as shown in FIG. 29, an opening 52a that penetrates through the first polysilicon film 28b (first conductive film), the SiO₂ film 30d (capacitor insulating film) and the second polysilicon film 31b (second conductive film) is formed at a position other than the second gate part 33c shown in FIG. 28, e.g., over an insulating film 54. Subsequently, a high-melting point metal film 53a (third conductive film) formed for instance of a W film or Ti film is embedded in the opening 52a to allow the first and second polysilicon films 28b and 31b to be electrically shorted. Moreover, as shown in FIG. 30, an opening 52b that penetrates through the SiO₂ film 30d (capacitor insulating film) and the second polysilicon film 31b (second conductive film) is formed, revealing the first polysilicon film 28b at the bottom of the opening 52b. Thereafter, a high-melting point metal film 53b (third conductive film) formed for instance of a W film or Ti film is embedded in the opening 52b to allow the first and second polysilicon films 28b and 31b to be electrically shorted.

In this FLASH EPROM, the second gate part 33c in the periphery circuitry part has the same structure as the first gate part 33a in the memory cell part. It is thus possible to form the periphery circuitry part together with the memory cell part, achieving simplification of the manufacturing process for greater efficiency. Although the third conductive film 53a or 53b and the high-melting point metal film (fourth conductive film) 42 were formed in separate steps herein, they may be formed at the same time as a common high-melting point metal film.

Example 10

-Manufacture of Magnetic Head-

Example 10 is directed to the manufacture of a magnetic head, an example of application of a resist pattern formed using the resist cover film forming material of the present invention. Note that resist patterns 102 and 126 in Example 10 are ones prepared in a manner similar to those described in Examples 1 to 5 described above.

FIGS. 31 to 34 are process drawings for explaining manufacture of a magnetic head.

Figure 31:
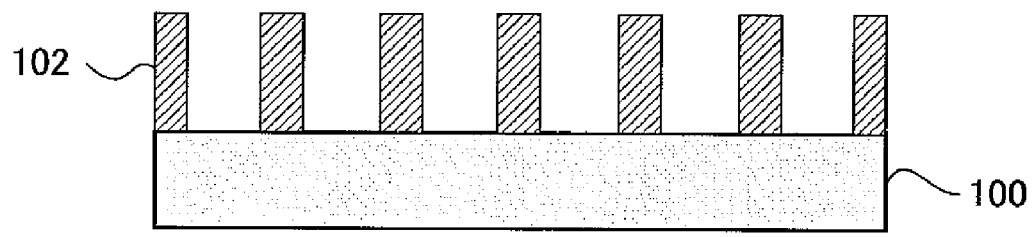
FIG. 31 is a schematic sectional explanatory diagram for an example in which a resist pattern that has been formed by means of immersion exposure using the resist cover film forming material of the present invention is applied for the manufacture of a magnetic head.

As shown in FIG. 31, a resist film of 6 μm thickness was formed on an interlayer insulating layer 100, followed by exposure and development of the resist film to form a resist pattern 102 with a hole pattern for forming a thin film magnetic coil with a scroll pattern.

Figure 32:
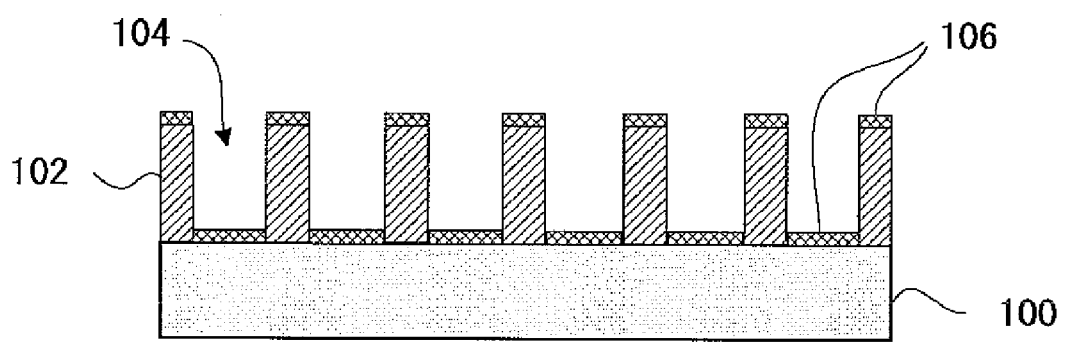
FIG. 32 is a schematic sectional explanatory diagram for an example in which a resist pattern that has been formed by means of immersion exposure using the resist cover film forming material of the present invention is applied for the manufacture of a magnetic head, showing a step conducted after the step shown in FIG. 31.

As shown in FIG. 32, a work surface 106 to be plated that is formed of a Ti adhesion film of 0.01 μm thickness and a Cu adhesion film of 0.05 μm thickness was vapor-deposited on the resist pattern 102 and on the area other than the resist pattern 102, i.e., an area of the interlayer insulating layer 100 that is exposed through an opening 104.

Figure 33:
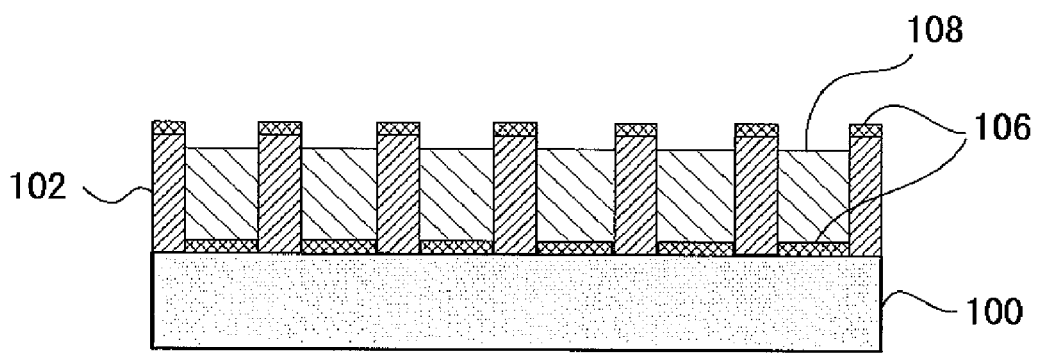
FIG. 33 is a schematic sectional explanatory diagram for an example in which a resist pattern that has been formed by means of immersion exposure using the resist cover film forming material of the present invention is applied for the manufacture of a magnetic head, showing a step conducted after the step shown in FIG. 32.

As shown in FIG. 33, a conductive thin film 108 formed of Cu plating of 3 μm thickness was formed on the work surface 106 in the opening 104, (the area other than the resist pattern 102, i.e., an area of the interlayer insulating layer 100 that is exposed through an opening 104).

Figure 34:
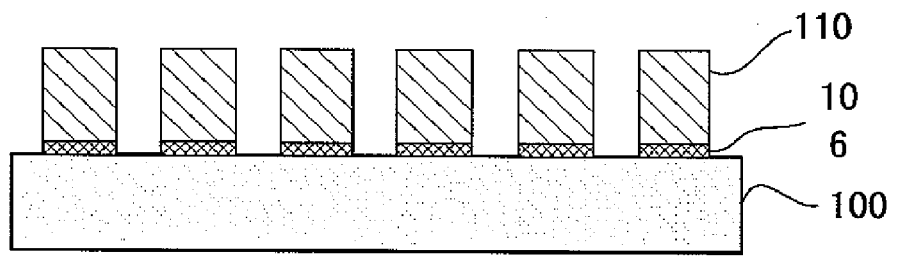
FIG. 34 is a schematic sectional explanatory diagram for an example in which a resist pattern that has been formed by means of immersion exposure using the resist cover film forming material of the present invention is applied for the manufacture of a magnetic head, showing a step conducted after the step shown in FIG. 33.

As shown in FIG. 34, the resist pattern 102 was then dissolved and developed off the interlayer insulating layer 100, whereby a thin film magnetic coil 110 having a scroll pattern derived from the conductive thin film 108 was produced. A magnetic head was manufactured in this way.

The magnetic head obtained above has a fine scroll pattern obtained by virtue of the resist pattern 102 produced as a result of immersion exposure using the resist cover film forming material of the present invention. For this reason, the thin film magnetic coil 110 has a fine, high resolution pattern, and offers excellent mass productivity.

FIGS. 35 to 40 are process drawings for explaining manufacture of another magnetic head.

Figure 35:
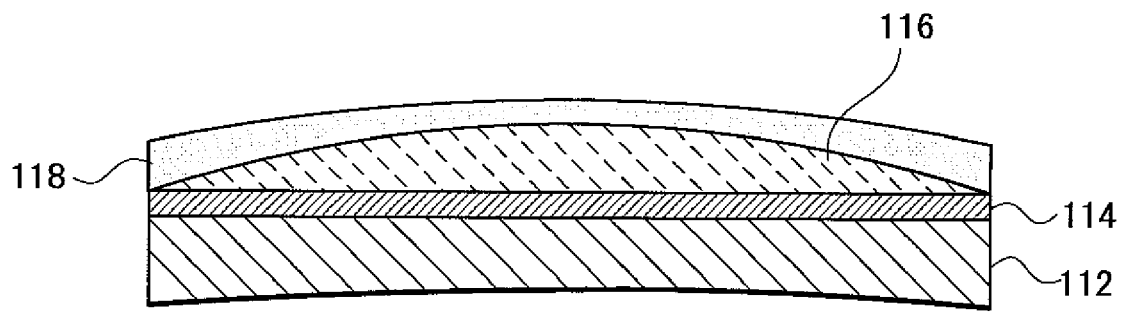
FIG. 35 is a schematic sectional explanatory diagram for an example in which a resist pattern that has been formed by means of immersion exposure using the resist cover film forming material of the present invention is applied for the manufacture of a magnetic head, showing a step conducted after the step shown in FIG. 34.

As shown in FIG. 35, a gap layer 114 was deposited on a ceramic non-magnetic substrate 112 by sputtering. Although not illustrated, an insulating layer made of silicon oxide and a conductive work surface made of Ni—Fe permalloy were previously formed on the non-magnetic substrate 112 by means of sputtering, and furthermore, a lower magnetic layer made of Ni—Fe permalloy was previously formed thereon. A resin insulating film 116 made of thermosetting resin was then formed on the gap layer 114 at predetermined positions other than portions corresponding to the magnetic ends of the unillustrated lower magnetic layer. A resist material was then applied over the resin insulating film 116 to form a resist film 118.

Figure 36:
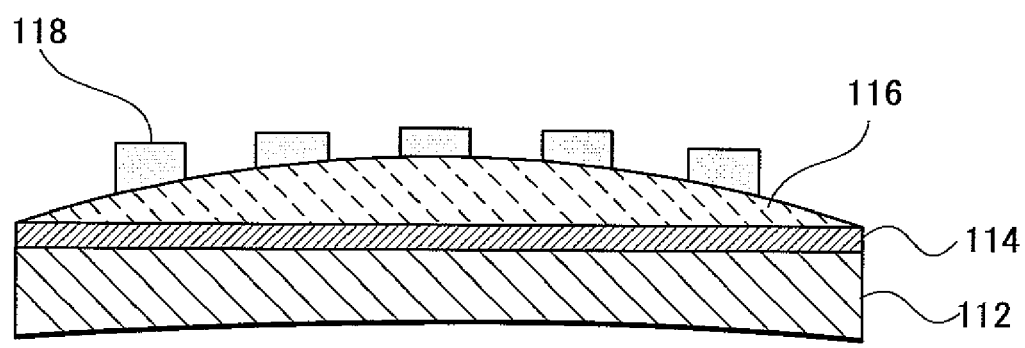
FIG. 36 is a schematic sectional explanatory diagram for an example in which a resist pattern that has been formed by means of immersion exposure using the resist cover film forming material of the present invention is applied for the manufacture of a magnetic head, showing a step conducted after the step shown in FIG. 35.
Figure 37:
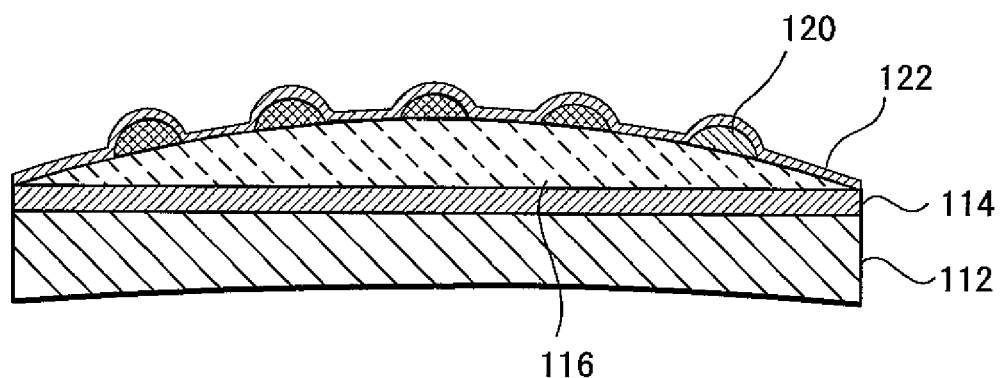
FIG. 37 is a schematic sectional explanatory diagram for an example in which a resist pattern that has been formed by means of immersion exposure using the resist cover film forming material of the present invention is applied for the manufacture of a magnetic head, showing a step conducted after the step shown in FIG. 36.

Next, as shown in FIG. 36, exposure and development were conducted on the resist film 118 to form a scroll resist pattern, and as shown in FIG. 37, the scroll resist pattern 118 was cured at several hundred degrees centigrade for 1 hour to form a protruding first scroll pattern 120, followed by formation of a conductive work surface 122 made of Cu over the resin insulating film 116 and the first scroll pattern 120.

Figure 38:
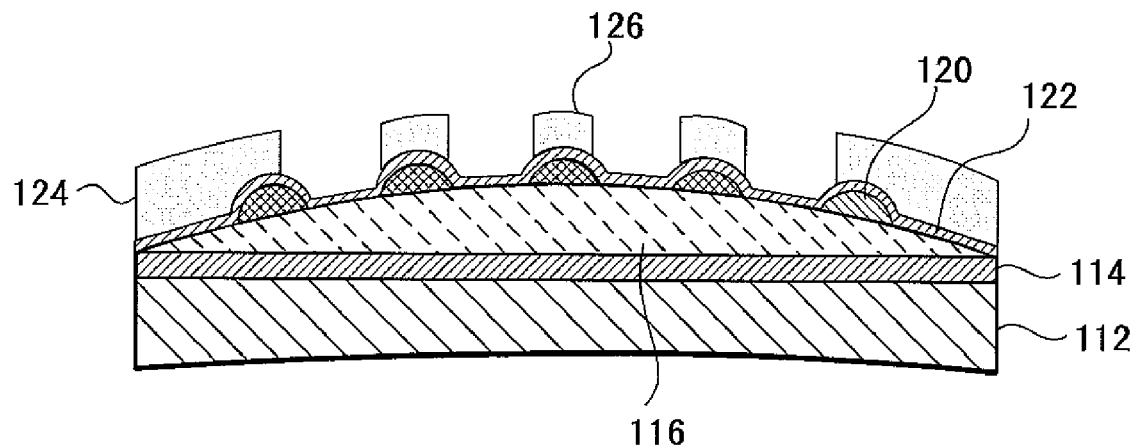
FIG. 38 is a schematic sectional explanatory diagram for an example in which a resist pattern that has been formed by means of immersion exposure using the resist cover film forming material of the present invention is applied for the manufacture of a magnetic head, showing a step conducted after the step shown in FIG. 37.

As shown in FIG. 38, a resist material was applied over the conductive work surface 122 by spin coating to form a resist film 124, followed by patterning of the resist material provided over the first scroll pattern 120 to form a resist pattern 126.

Figure 39:
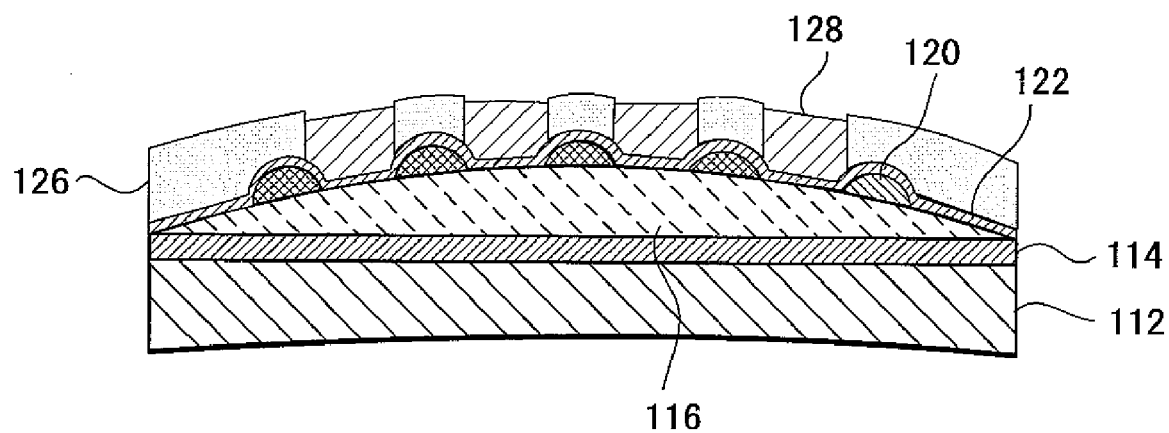
FIG. 39 is a schematic sectional explanatory diagram for an example in which a resist pattern that has been formed by means of immersion exposure using the resist cover film forming material of the present invention is applied for the manufacture of a magnetic head, showing a step conducted after the step shown in FIG. 38.
Figure 40:
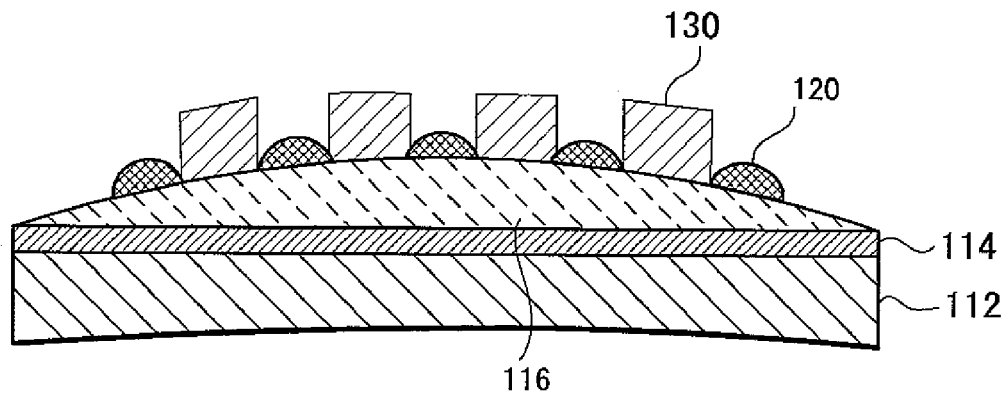
FIG. 40 is a schematic sectional explanatory diagram for an example in which a resist pattern that has been formed by means of immersion exposure using the resist cover film forming material of the present invention is applied for the manufacture of a magnetic head, showing a step conducted after the step shown in FIG. 39.

A Cu conductive layer 128 was plated on the exposed conductive work surface 122, i.e., the portions other than the resist pattern 126, as shown in FIG. 39. Subsequently, as shown in FIG. 40, the resist pattern 126 was dissolved and removed from the conductive work surface 122 to form a thin film magnetic coil 130 that has a scroll pattern and is formed of the Cu conductive layer 128.

Figure 41:
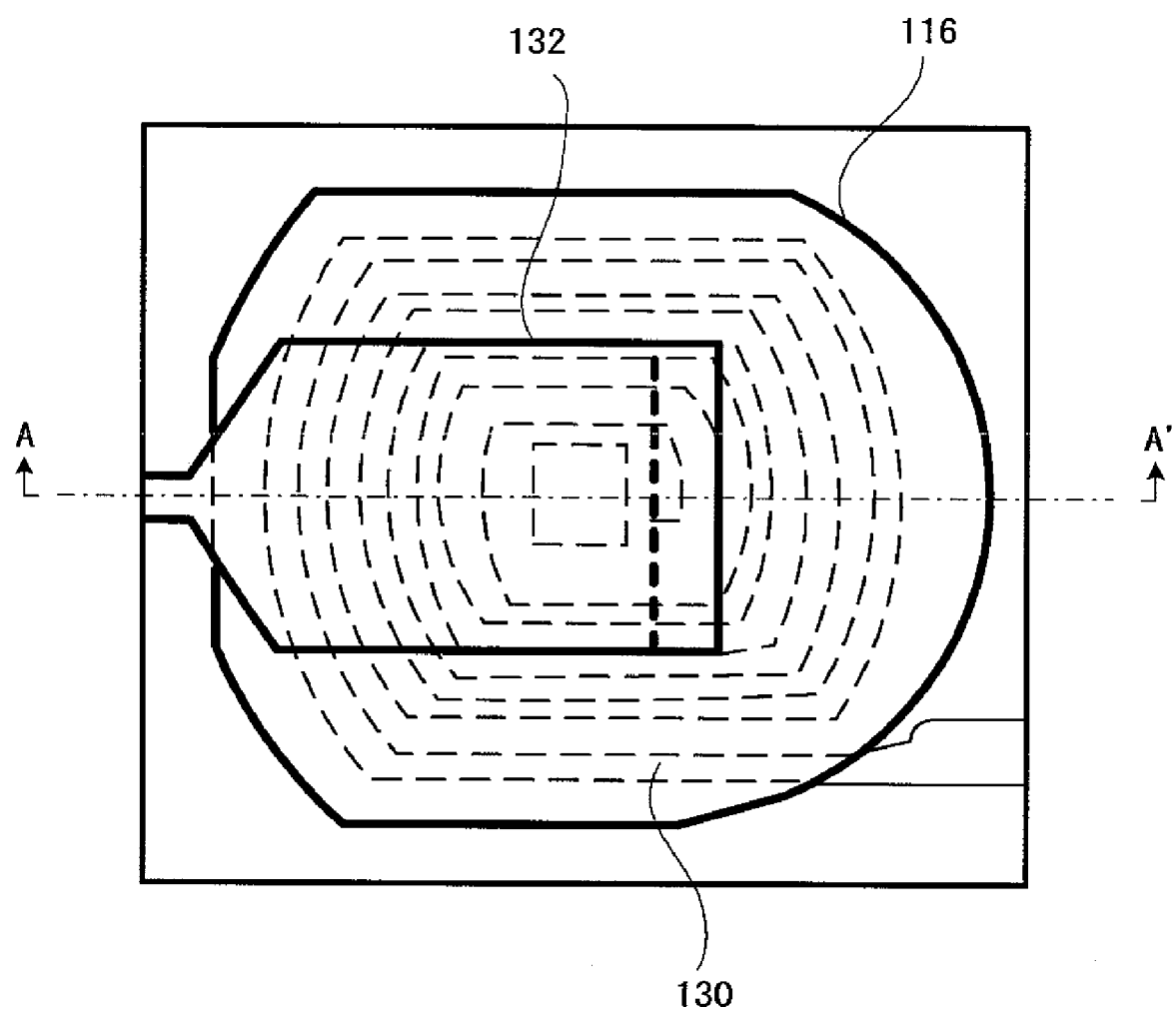
FIG. 41 is a plan view of an example of the magnetic head manufactured by the steps shown in FIGS. 31 and 40.

In this way a magnetic head as shown in the plan view of FIG. 41 was manufactured, in which a magnetic layer 132 is provided on the resin insulating film 116 and the thin film magnetic coil 130 is provided on the surface of the resin insulting film 116.

The magnetic head obtained above has a fine scroll pattern obtained by virtue of the resist pattern 126 produced as a result of immersion exposure using the resist cover film forming material of the present invention. For this reason, the thin film magnetic coil 130 has a fine, high resolution pattern, and offers excellent mass productivity.

According to the present invention, it is possible to solve the conventional problems and to achieve the foregoing objects.

According to the present invention, it is possible to provide a resist cover film forming material that is suitably used for the manufacture of an exposure immersion resist cover film used to protect a resist film against a medium (liquid) in the immersion exposure technology by preventing infiltration of the liquid into the resist film or elution of resist film ingredients into the liquid, and that has a high ArF excimer laser and/or $F_2$ excimer laser transmittance, the immersion exposure technology intending to achieve an improved resolution by filling the gap created between the projection lens of an exposure device and a wafer with a medium (liquid) having a refraction index (n) of greater than 1 (the value for air).

According to the present invention, it is also possible to provide a resist pattern forming method capable of high-resolution immersion exposure by protecting the resist film against the liquid and by preventing the generation of dirt on the lens without impairing the resist film performance, for achieving efficient and easy formation of a fine, high-resolution resist pattern.

According to the present invention, it is also possible to provide a method for manufacturing an electronic device, which the method is capable of formation of a fine, high-resolution resist pattern by means of immersion exposure by preventing the generation of dirt on the lens without impairing the resist pattern performance and of efficient mass production of a high-performance electronic device having a fine interconnection pattern formed using the resist pattern, and a high performance electronic device such as a semiconductor device, which has a finer interconnection pattern and manufactured using this manufacturing method.

The resist cover film forming material of the present invention has a high ArF excimer laser and/or $F_2$ excimer laser transmittance. For this reason, in the immersion exposure technology that achieves an improved resolution by filling the gap created between the projection lens of an exposure device and a wafer with a medium (liquid) having a refraction index (n) of greater than 1 (the value for air), the resist cover film forming material of the present invention can be suitably used for the manufacture of an exposure immersion resist cover film that serves to protect a resist film against the medium.

The resist pattern forming method of the present invention can be suitably used for instance for the manufacture of functional components (e.g., mask patterns, reticle patterns, magnetic heads, liquid crystal displays (LCDs), plasma display panels (PDPs), and surface acoustic wave (SAW) filters), optical components for connection of optical wires, microcomponents (e.g., microactuators), and electronic devices (e.g., semiconductor devices), particularly in the method of the present invention for manufacturing an electronic device.

The method of the present invention for manufacturing an electronic device can be suitably used for the manufacture of the electronic device of the present invention. The electronic device of the present invention can be suitably used in a variety of fields, including semiconductor devices such as flash memories, DRAMs, and FRAMs.

What is claimed is:

1. A method for manufacturing an electronic device, comprising:
   forming a resist film over a work surface;
   forming a resist cover film over the resist film by use of a resist cover film forming material;
   irradiating the resist film with exposure light through the resist cover film by means of immersion exposure;
   developing the resist film to form a resist pattern; and
   patterning the work surface by etching using the resist pattern as a mask, wherein the resist cover film forming material consists of: a silicon-containing polymer which has at least an alkali-soluble group and which comprises $(SiO_{4/2})$, $(R^1_t SiO_{(4-t)/2})$, and $(O_{1/2}R^2)$ and is represented by the following general formula (1); and an organic solvent capable of dissolving the silicon-containing polymer:

general formula (1)

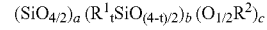

$(SiO_{4/2})_a (R^1_t SiO_{(4-t)/2})_b (O_{1/2}R^2)_c$ where $R^1$ represents at least one of a monovalent organic group, hydrogen atom and hydroxyl group, $R^2$ represents at least one of a monovalent organic group and hydrogen atom (where $R^1$ and $R^2$ each may appear twice or more, and at least one of $R^1$ and $R^2$ contains an alkali-soluble group), "t" represents an integer of 1 to 3, "a," "b," and "c" represent the relative proportions of their units (where $a \geq 0$, $b \geq 0$ and $c \geq 0$, and "a," "b," and "c" are not 0 at the same time), and $(R^1_t SiO_{(4-t)/2})_b$ may appear twice or more, wherein the alkali-soluble group is a moiety represented by the following general formula (3):

general formula (3)

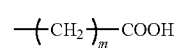

$-(CH_2)_m-COOH$ where "m" satisfies the condition $0 \leq m \leq 5$, and wherein the organic solvent is an aliphatic alkanol having 3 or more carbon atoms.

2. The method for manufacturing an electronic device according to claim 1, wherein the thickness of the resist cover film is 10 nm to 300 nm.

3. The method for manufacturing an electronic device according to claim 1, wherein the resist cover film is formed by means of coating.

4. The method for manufacturing an electronic device according to claim 1, wherein the development is conducted using an alkali developer.

5. The method for manufacturing an electronic device according to claim 1, wherein the refraction index of a liquid used in the immersion exposure is greater than 1.

6. The method for manufacturing an electronic device according to claim 5, wherein the liquid is water.

7. The method for manufacturing an electronic device according to claim 1, wherein the exposure light is at least one of an ArF excimer laser having a wavelength of 193 nm and an $F_2$ excimer laser having a wavelength of 157 nm.

8. The method for manufacturing an electronic device according to claim 1, wherein the resist cover film has an exposure light transmittance of 30% or more when the thickness is 100 nm.

9. The method for manufacturing an electronic device according to claim 1, wherein the resist cover film has an exposure light transmittance of 80% or more when the thickness is 100 nm.

10. The method for manufacturing an electronic device according to claim 1, wherein the dissolution rate of the resist cover film in an alkali developer (2.38% TMAH) is 100 nm/sec or more.

11. The method for manufacturing an electronic device according to claim 1, wherein the resist cover film has a refraction index of 1.4 or more for exposure light.

12. The method for manufacturing an electronic device according to claim 1, wherein the work surface is a surface of a film made of interlayer insulating material with a permittivity of 2.7 or less.

13. The method for manufacturing an electronic device according to claim 1, wherein the silicon-containing polymer is represented by the following general formula (2):

general formula (2)

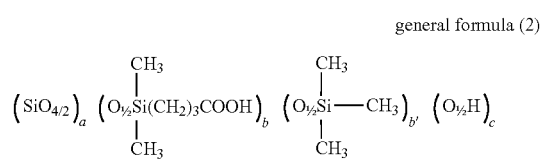

where "a," "b," "b'," and "c" represent relative proportions of their units, and a>0, b>0, b'>0 and c≧0.

* * * * *